(12) United States Patent
Yamamoto

(10) Patent No.: US 9,208,849 B2
(45) Date of Patent: Dec. 8, 2015

(54) SEMICONDUCTOR DEVICE AND METHOD FOR DRIVING SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventor: Roh Yamamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 157 days.

(21) Appl. No.: 13/803,602

(22) Filed: Mar. 14, 2013

(65) Prior Publication Data

US 2013/0272055 A1    Oct. 17, 2013

(30) Foreign Application Priority Data

Apr. 12, 2012    (JP) .................................. 2012-090887

(51) Int. Cl.
| | |
|---|---|
| *G11C 11/24* | (2006.01) |
| *H01L 27/115* | (2006.01) |
| *G11C 11/403* | (2006.01) |
| *G11C 11/405* | (2006.01) |

(52) U.S. Cl.
CPC .............. *G11C 11/24* (2013.01); *G11C 11/403* (2013.01); *G11C 11/405* (2013.01); *H01L 27/115* (2013.01); *H01L 27/1156* (2013.01)

(58) Field of Classification Search
CPC ...................................................... G11C 11/24
USPC ..................... 365/149, 189, 221, 222, 185, 63
See application file for complete search history.

(56) References Cited

U.S. PATENT DOCUMENTS

| | | |
|---|---|---|
| 4,466,081 A | 8/1984 | Masuoka |
| 5,349,366 A | 9/1994 | Yamazaki et al. |
| 5,731,856 A | 3/1998 | Kim et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Kim. W et al., "An Experimental High-Density DRAM Cell with a Built-in Gain Stage", IEEE Journal of Solid- Stage Circuits, Aug. 1, 1994, vol. 29, No. 8, pp. 978-981.

(Continued)

*Primary Examiner* — Shawki S Ismail
*Assistant Examiner* — Muhammad S Islam
(74) *Attorney, Agent, or Firm* — Fish & Richardson P.C.

(57) ABSTRACT

The memory circuit has a first writing mode in which data can be retained for a long time and a second writing mode in which data can be written at high speed. The memory circuit in which data reading is performed on the basis of a determined conductive state of a transistor includes first and second capacitor parts that are connected through a switch and retain electric charge corresponding to the data. The first writing mode is a mode where the switch is on and electric charge corresponding to the data is accumulated in the first and second capacitor parts that are electrically connected. The second writing mode is a mode where the switch is off, electric charge corresponding to the data is accumulated in the first capacitor part, and electric charge corresponding to the data is not accumulated in the second capacitor part.

11 Claims, 8 Drawing Sheets

(56) References Cited

U.S. PATENT DOCUMENTS

| | | | |
|---|---|---|---|
| 5,744,864 A | 4/1998 | Cillessen et al. | |
| 6,127,702 A | 10/2000 | Yamazaki et al. | |
| 6,198,652 B1* | 3/2001 | Kawakubo et al. | 365/145 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,088,606 B2* | 8/2006 | Turner | 365/149 |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 8,363,452 B2 | 1/2013 | Yamazaki et al. | |
| 8,576,636 B2* | 11/2013 | Kato et al. | 365/187 |
| 2001/0015450 A1 | 8/2001 | Sugibayashi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0280000 A1 | 12/2005 | Ishii et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0216877 A1 | 9/2006 | Toyota et al. | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0315193 A1 | 12/2008 | Kim et al. | |
| 2009/0002590 A1 | 1/2009 | Kimura | |
| 2009/0008638 A1 | 1/2009 | Kang et al. | |
| 2009/0027371 A1 | 1/2009 | Lin et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0184315 A1 | 7/2009 | Lee et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0097838 A1 | 4/2010 | Tanaka et al. | |
| 2010/0109002 A1 | 5/2010 | Itagaki et al. | |
| 2010/0148171 A1 | 6/2010 | Hayashi et al. | |
| 2010/0193785 A1 | 8/2010 | Kimura | |
| 2010/0276685 A1 | 11/2010 | Itagaki et al. | |
| 2010/0276689 A1 | 11/2010 | Iwasaki | |
| 2010/0279462 A1 | 11/2010 | Iwasaki | |
| 2011/0089417 A1 | 4/2011 | Yamazaki et al. | |
| 2011/0101332 A1 | 5/2011 | Yamazaki et al. | |
| 2011/0101334 A1 | 5/2011 | Yamazaki et al. | |
| 2011/0101339 A1 | 5/2011 | Yamazaki et al. | |
| 2011/0101351 A1 | 5/2011 | Yamazaki | |
| 2011/0108706 A1 | 5/2011 | Koyama | |
| 2011/0108836 A1 | 5/2011 | Koyama et al. | |
| 2011/0110145 A1 | 5/2011 | Yamazaki et al. | |
| 2011/0116310 A1 | 5/2011 | Yamazaki et al. | |
| 2011/0121285 A1 | 5/2011 | Yamazaki et al. | |
| 2011/0121286 A1 | 5/2011 | Yamazaki et al. | |
| 2011/0122670 A1 | 5/2011 | Yamazaki et al. | |
| 2011/0122673 A1 | 5/2011 | Kamata et al. | |
| 2011/0128777 A1 | 6/2011 | Yamazaki et al. | |
| 2011/0134683 A1 | 6/2011 | Yamazaki et al. | |
| 2011/0147737 A1 | 6/2011 | Yamazaki et al. | |
| 2011/0156027 A1 | 6/2011 | Yamazaki et al. | |
| 2011/0156117 A1 | 6/2011 | Yamazaki et al. | |
| 2011/0176357 A1* | 7/2011 | Koyama et al. | 365/149 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 A | 12/2002 |
| JP | 2003-086000 A | 3/2003 |

(56) References Cited

FOREIGN PATENT DOCUMENTS

| | | | |
|---|---|---|---|
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2011-171702 A | 9/2011 | |
| WO | 2004/114391 A1 | 12/2004 | |

OTHER PUBLICATIONS

Shukuri. S et al., "A Complementary Gain Cell Technology for sub-1 V Supply DRAMs ", IEDM 92: Technical Digest of International Electron Devices Meeting, Dec. 13, 1992, pp. 1006-1008.

Ishii.T et al., "A Poly-Silicon TFT With a Sub-5-nm Thick Channel for Low-Power Gain Cell Memory in Mobile Applications", IEEE Transaction on Electron Devices, Nov. 1, 2004, vol. 51, No. 11, pp. 1805-1810.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer.Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] At Temperatures Over 1000°C," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IgZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by D Sputtering," SID Digest '09 : SID International Symposium Digest of Technical Papers, May 31, 2009, pp. 191-193.

(56) References Cited

OTHER PUBLICATIONS

Li C et al "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350°C," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of Zno Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 in. QVGA AMOLED Display Using In—Ga—Zn—Oxide TFTS With a Novel Passivation Layer," SID Digest '09 : SID International Symposium Digest of Technical Papers, May 31, 2009, pp. 284-287.
Ohara, H et al., "Amorphous In—Ga—Zn—Oxide TFTs with Suppressed Variation for 4.0 inch QVGA Amoled Display," AM-FPD '09 Digest of Technical Papers, Jul. 1, 2009, pp. 227-230, The Japan Society of Applied Physics.
Orita, M et al., "Amorphous transparent conductive oxide InGaO3(ZnO)m(m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTS and Their Application for Large Size Amoled," AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.
Son, K et al., "42.4L: Late-News Paper: 4 Inch Qvga Amoled Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of Igzo Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

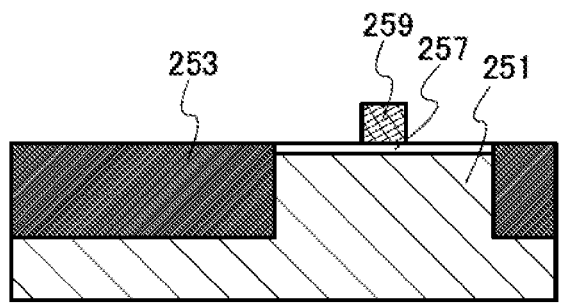 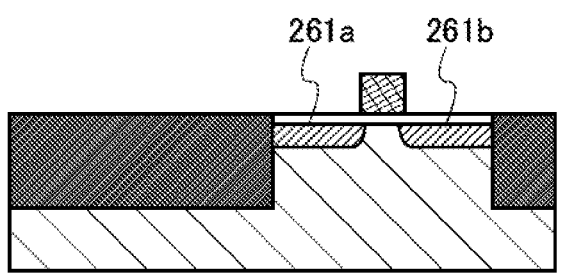
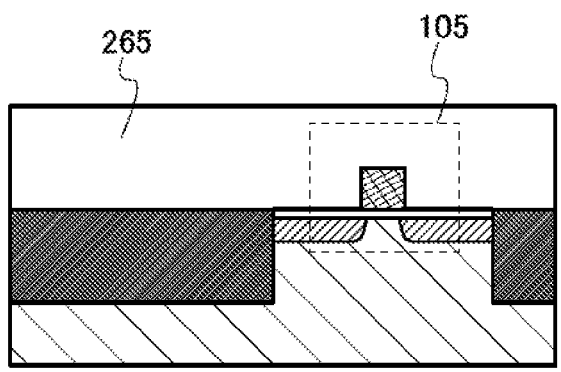
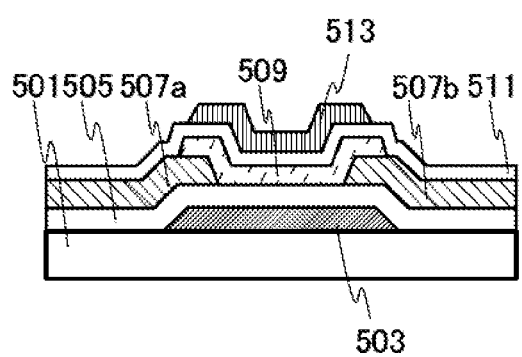 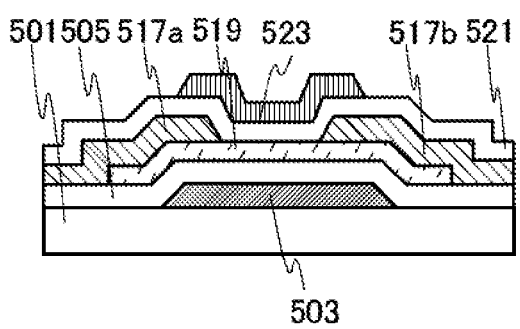

FIG. 8A
FIG. 8B
FIG. 8C
FIG. 8D
FIG. 8E

SEMICONDUCTOR DEVICE AND METHOD FOR DRIVING SEMICONDUCTOR DEVICE, AND ELECTRONIC DEVICE

BACKGROUND OF THE INVENTION

1. Field of the Invention

The present invention relates to a memory circuit. The present invention relates to a memory device and an electronic device including a memory circuit.

2. Description of the Related Art

Various memory circuits that are used for a memory device such as dynamic random access memory (DRAM), static random access memory (SRAM), or a flash memory are known.

Patent Document 1 discloses a memory device using a transistor including an oxide semiconductor.

REFERENCE

[Patent Document 1] Japanese Published Patent Application No. 2011-171702

SUMMARY OF THE INVENTION

A memory circuit is required to retain data for a long time or to write data at high speed, depending on the uses.

A long-time data retention in the memory circuit results in a low refresh frequency or no need for refresh operation; accordingly, power consumption can be low. Further, when data can be retained for a long time even with no supply of electric power, power consumption can be very low.

On the other hand, a high-speed writing of data results in high-speed operation of a memory circuit.

It is an object of one embodiment of the present invention to provide a memory circuit that can operate at high speed and that can retain data for a long time with no supply of electric power.

A memory circuit of one embodiment of the present invention has a first writing mode in which data can be retained for a long time and a second writing mode in which data can be written at high speed. The memory circuit of one embodiment of the present invention selects a capacitor part to retain data; as a result, data which needs to be retained for a long time can be retained for a long time while data which needs to be written within a short time can be written at high speed. Accordingly, the memory circuit of one embodiment of the present invention can retain data for a long time even with no supply of electric power and can operate at high speed.

One embodiment of the present invention is a memory circuit in which data is read on the basis of a determined conductive state of a transistor. The memory circuit includes a first capacitor part and a second capacitor part which hold electric charge corresponding to data and are connected to each other through a switch.

One embodiment of the present invention is a memory circuit in which data reading is performed on the basis of a determined conductive state of a transistor. The memory circuit includes a first capacitor part and a second capacitor part that are connected through a switch and hold electric charge corresponding to the data. The memory circuit has a first writing mode and a second writing mode. The first writing mode is a mode where the switch is on and electric charge corresponding to the data is accumulated in the first capacitor part and the second capacitor part that are electrically connected. The second writing mode is a mode where the switch is off, electric charge corresponding to the data is accumu-lated in the first capacitor part, and electric charge corresponding to the data is not accumulated in the second capacitor part.

In the memory circuit of one embodiment of the present invention, the first writing mode is selected to retain data for a long time. In addition, the second writing mode is selected to write data within a short time.

The capacitor part can be capacitance caused by a transistor (e.g., gate capacitance), capacitance between wirings, or a capacitor.

In the above structures, the capacitance of the second capacitor part is preferably larger than the capacitance of the first capacitor part.

One embodiment of the present invention is a memory circuit in which data reading is performed on the basis of a determined conductive state of a transistor. The memory circuit includes a capacitor part that is connected to the transistor through a switch and hold electric charge corresponding to the data. The memory circuit has a first writing mode and a second writing mode. The first writing mode is a mode where the switch is on and electric charge corresponding to the data is accumulated in a gate capacitance of the transistor and the capacitor part which are electrically connected to each other. The second writing mode is a mode where the switch is off, electric charge corresponding to the data is accumulated in the gate capacitance of the transistor and the capacitor part.

One embodiment of the present invention is a memory circuit in which data reading is performed on the basis of a determined conductive state of a transistor. The memory circuit includes a first transistor, a second transistor, a third transistor, and a capacitor configured to hold electric charge. The memory circuit has a first writing mode and a second writing mode. The first writing mode is a mode where the second transistor and the third transistor are on and electric charge corresponding to the data is accumulated in a gate capacitance of the first transistor and the capacitor. The second writing mode is a mode where the second transistor is on, the third transistor is off, and electric charge corresponding to the data is accumulated in the gate capacitance of the first transistor.

In the above memory circuit, the second transistor preferably includes an oxide semiconductor in a channel formation region. In addition, the third transistor preferably includes an oxide semiconductor in a channel formation region. A transistor including an oxide semiconductor in a channel formation region has a low off-state current (i.e., a low leakage current in an off state). As off-state currents of the second and third transistors become lower, gate capacitance of the first transistor (and the capacitor) can hold electric charge for a longer time; therefore, each of the second and third transistors preferably have a low off-state current.

In the above memory circuit, the first transistor preferably includes polycrystalline silicon or single crystal silicon in a channel formation region, which results in high mobility of the first transistor. As the mobility of the first transistor becomes higher, the memory circuit can read data within a shorter time; therefore, the first transistor preferably has a high mobility.

In one embodiment of the present invention, a memory circuit includes a first transistor which has a first gate electrode, a first source electrode, and a first drain electrode; a second transistor which has a second gate electrode, a second source electrode, and a second drain electrode and includes an oxide semiconductor in a channel formation region; a third transistor which has a third gate electrode, a third source electrode, and a third drain electrode and includes an oxide semiconductor in a channel formation region; a first capacitor; a first wiring; a second wiring; a third wiring; a fourth wiring; a fifth wiring; and a sixth wiring. The first gate electrode is electrically connected to one of the second source electrode and the second drain electrode and one of the third source electrode and the third drain electrode. The first source electrode is electrically connected to the first wiring. The first drain electrode is electrically connected to the second wiring. The second gate electrode is electrically connected to the third wiring. The other of the second source electrode and the second drain electrode is electrically connected to the fourth wiring. The third gate electrode is electrically connected to the fifth wiring. The other of the third source electrode and the third drain electrode is electrically connected to one of electrodes of the first capacitor. The other of the electrodes of the first capacitor is electrically connected to the sixth wiring.

In another embodiment of the present invention, the memory circuit further includes a second capacitor and a seventh wiring. One of electrodes of the second capacitor is electrically connected to the first gate electrode, the one of the second source electrode and the second drain electrode, and the one of the third source electrode and the third drain electrode. The other of the electrodes of the second capacitor is electrically connected to the seventh wiring.

One embodiment of the present invention is a memory circuit in which data reading is performed. The memory circuit includes a first transistor including a first gate electrode, a first source electrode, and a first drain electrode, a second transistor including a second gate electrode, a second source electrode, and a second drain electrode, and including an oxide semiconductor in a channel formation region, a third transistor including a third gate electrode, a third source electrode, and a third drain electrode, and including an oxide semiconductor in a channel formation region, and a first capacitor. The first gate electrode is electrically connected to one of the second source electrode and the second drain electrode and one of the third source electrode and the third drain electrode. A first selection signal is input to the second gate electrode. A signal including data is input to the other of the second source electrode and the second drain electrode. A second selection signal is input to the third gate electrode. The other of the third source electrode and the third drain electrode is electrically connected to one of electrodes of the first capacitor. A fixed potential is applied to the other of the electrodes of the first capacitor. A signal is input to one of the first source electrode and the first drain electrode and a potential of the other of the first source electrode and the first drain electrode is read.

In another embodiment of the present invention, the memory circuit may further include a second capacitor. One of electrodes of the second capacitor is electrically connected to the first gate electrode, the one of the second source electrode and the second drain electrode, and the one of the third source electrode and the third drain electrode. A fixed potential is applied to the other of the electrodes of the second capacitor.

One embodiment of the present invention is a memory circuit in which data reading is performed on the basis of a determined conductive state of a first transistor. The memory circuit includes a second transistor which has a second gate electrode, a second source electrode, and a second drain electrode and includes an oxide semiconductor in a channel formation region; a third transistor which has a third gate electrode, a third source electrode, and a third drain electrode and includes an oxide semiconductor in a channel formation region; and a first capacitor. A gate electrode of the first transistor is electrically connected to one of the second source electrode and the second drain electrode and one of the third source electrode and the third drain electrode. The other of the third source electrode and the third drain electrode is electrically connected to one of electrodes of the first capacitor. A first selection signal is input to the second gate electrode. A signal including data is input to the other of the second source electrode and the second drain electrode. A second selection signal is input to the third gate electrode. A fixed potential is applied to the other of the electrodes of the first capacitor.

In another embodiment of the present invention, the memory circuit further includes a second capacitor. One of electrodes of the second capacitor is electrically connected to the gate electrode of the first transistor, the one of the second source electrode and the second drain electrode, and the one of the third source electrode and the third drain electrode. A fixed potential is applied to the other of the electrodes of the second capacitor.

In another embodiment of the present invention, the memory circuit has a first writing mode and a second writing mode. The first writing mode is a mode where the second transistor and the third transistor are on, and electric charge corresponding to the data is accumulated in a gate capacitance of the first transistor and the first capacitor. The second writing mode is a mode where the second transistor is on, the third transistor is off, and electric charge corresponding to the data is accumulated in the gate capacitance of the first transistor.

Another embodiment of the present invention includes a memory device (also called a semiconductor device) which includes a reading circuit electrically connected to the memory circuit (specifically, a reading circuit with which data is read on the basis of a determined state of the first transistor), and an electronic device including the memory circuit or the memory device.

Note that in this specification, "over" and "below" do not necessarily mean "directly on" and "directly under", respectively, in the description of a physical relationship between components. For example, the expression "a gate electrode over a gate insulating layer" can mean the case where there is an additional component between the gate insulating layer and the gate electrode.

Note that in this specification, the term "electrically connected" includes the case where components are connected through an object having any electric function. There is no particular limitation on an object having any electric function as long as electric signals can be transmitted and received between components that are connected through the object.

Examples of an object having any electric function are a resistor, an inductor, a capacitor, a switching element such as a transistor, and an element with a variety of functions as well as an electrode and a wiring.

In addition, in this specification, the term "gate capacitance" means capacitance between at least a gate electrode and a channel formation region. Alternatively or additionally, "gate capacitance" may also include capacitance between a gate electrode and a source or drain electrode.

In one embodiment of the present invention, a memory circuit that can operate at high speed and can retain data for a long time with no supply of electric power can be provided.

BRIEF DESCRIPTION OF THE DRAWINGS

FIGS. 4A to 4E illustrate examples of a transistor.

FIGS. 8A to 8E illustrate electronic devices of one embodiment of the present invention.

DETAILED DESCRIPTION OF THE INVENTION

Figure 1A:
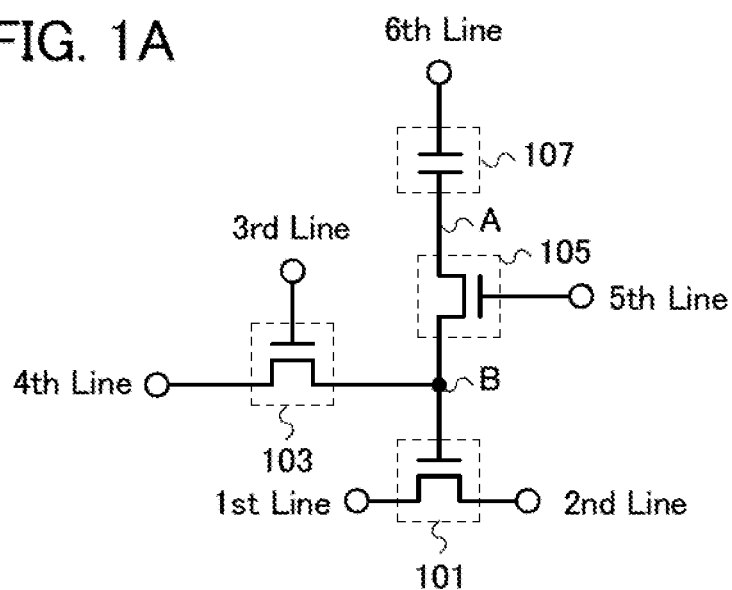
FIGS. 1A and 1B each illustrate a memory circuit of one embodiment of the present invention.

Embodiments are described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

For the easy understanding, the position, size, range and the like of each component illustrated in the drawings are not actual ones in some cases. Therefore, embodiments of the present invention are not necessarily limited to such a position, size, range, or the like disclosed in the drawings.

In this specification, ordinal numbers such as "first", "second", and "third" are used in order to avoid confusion among components, and the terms do not limit the components numerically.

(Embodiment 1)

In this embodiment, a memory circuit of one embodiment of the present invention will be described with reference to FIGS. 1A and 1B.

The memory circuit of one embodiment of the present invention has a first writing mode in which data can be retained for a long time and a second writing mode in which data can be written at high speed. The memory circuit of one embodiment of the present invention selects a capacitor portion to retain data; as a result, data which needs to be retained for a long time can be retained for a long time while data which needs to be written within a short time can be written at high speed. Accordingly, the memory circuit of one embodiment of the present invention can retain data for a long time even with no supply of electric power and can operate at high speed.

One embodiment of the present invention is a memory circuit in which data reading is performed on the basis of a determined conductive state of a transistor. The memory circuit includes a first capacitor part and a second capacitor part which hold electric charge corresponding to data and are connected to each other through a switch.

Specifically, one embodiment of the present invention is a memory circuit in which data reading is performed on the basis of a determined conductive state of a transistor. The memory circuit includes a first capacitor part and a second capacitor part that are connected through a switch and hold electric charge corresponding to the data. The memory circuit has a first writing mode and a second writing mode. The first writing mode is a mode where the switch is on and electric charge corresponding to the data is accumulated in the first capacitor part and the second capacitor part that are electrically connected. The second writing mode is a mode where the switch is off, electric charge corresponding to the data is accumulated in the first capacitor part, and electric charge corresponding to the data is not accumulated in the second capacitor part.

In the memory circuit, the first writing mode is selected to retain data for a long time. In addition, the second writing mode is selected to write data within a short time.

The memory circuit of one embodiment of the present invention can retain data even when electric power is not supplied to the memory circuit. In such a case, the first writing mode can be selected to retain data for a longer time.

For example, the second writing mode may be selected while electric power is supplied to the memory circuit of one embodiment of the present invention and the first writing mode may be selected before the supply of electric power is stopped. In this case, data can be written within a short time while electric power is supplied to the memory circuit, and additionally data can be retained for a long time even when electric power is not supplied to the memory circuit.

Alternatively, the second writing mode may be selected while electric power is supplied to a CPU, a processor, or the like which is electrically connected to the memory circuit of one embodiment of the present invention and the first writing mode may be selected before the supply of electric power is stopped. In this case, data can be written within a short time while electric power is supplied to the CPU, the processor, or the like, and additionally data can be retained for a long time even when electric power is not supplied to the CPU, the processor, or the like.

When data is frequently rewritten, the second writing mode is preferably employed. The operation of the memory circuit may be selected depending on types of data, for example. In the case where data for calculation is used in a register or the like, the second writing mode is selected. In the case of using data which requires little rewriting, such as program, the first writing mode is selected. Accordingly, in the memory circuit of one embodiment of the present invention, data in the memory circuit can be rewritten at high speed when the data is frequently rewritten, while data in the memory circuit can be retained for a long time when the data is little rewritten.

Alternatively, the memory circuit (or a memory device, an electronic device, or the like including the memory circuit) may be formed so that a user of the memory circuit (or a memory device, an electronic device, or the like including the memory circuit) can select the modes.

Which of the modes the memory circuit uses to retain data may be controlled (determined) on the basis of a signal or the like from a control circuit that is connected to the memory circuit.

A capacitor part can be capacitance caused by transistors (e.g., gate capacitance), capacitance between wirings, or a capacitor. The second capacitor part is preferably larger than the first capacitor part.

An example of the switch is an electrical switch, a mechanical switch, or the like, and there is no particular limitation on the switch as long as the switch that can control the flow of a current is acceptable. For example, the switch may be a transistor, a diode, or the like.

<Structure of Memory Circuit>

A memory circuit illustrated in FIG. 1A includes a first transistor 101, a second transistor 103, a third transistor 105, and a capacitor 107.

The first transistor 101 includes a first gate electrode, a first source electrode, and a first drain electrode.

The second transistor 103 includes a second gate electrode, a second source electrode, and a second drain electrode. The second transistor 103 includes an oxide semiconductor in a channel formation region.

The third transistor 105 includes a third gate electrode, a third source electrode, and a third drain electrode. The third transistor 105 includes an oxide semiconductor in a channel formation region.

The first gate electrode is electrically connected to one of the second source electrode and the second drain electrode and one of the third source electrode and the third drain electrode. The first source electrode is electrically connected to a first wiring (1st Line). The first drain electrode is electrically connected to a second wiring (2nd Line). The second gate electrode is electrically connected to a third wiring (3rd Line). The other of the second source electrode and the second drain electrode is electrically connected to a fourth wiring (4th Line). The third gate electrode is electrically connected to a fifth wiring (5th Line). The other of the third source electrode and the third drain electrode is electrically connected to one of electrodes of the capacitor 107. The other of the electrodes of the capacitor 107 is electrically connected to a sixth wiring (6th Line).

The first to sixth wirings will be described. The first wiring is a wiring to which a signal is input and can be, for example, a wiring to which a fixed potential is supplied. The second wiring can be a wiring which is electrically connected to a reading circuit, for example. The third wiring is a wiring to which a selection signal for selecting a conductive state (an on state or an off state) of the second transistor 103 is input. The fourth wiring is a wiring to which a signal including data is supplied. The fifth wiring is a wiring to which a selection signal for selecting a conductive state (an on state or an off state) of the third transistor 105 is input. The sixth wiring is a wiring to which a fixed potential is supplied. Note that the first wiring and the sixth wiring can have the same potential.

The first transistor 101 preferably has a high mobility. The mobility of the first transistor 101 can be high by using polycrystalline silicon, single crystal silicon, or the like in a channel formation region, for example. As the mobility of the first transistor 101 becomes higher, the memory circuit can read data within a shorter time.

The gate capacitance of the first transistor 101 can be capacitance formed in a region where the first gate electrode and the channel formation region are stacked with an insulating film laid therebetween, capacitance formed in a region where the first gate electrode and the first source electrode are stacked with an insulating film laid therebetween or the first gate electrode and the first drain electrode are stacked with an insulating film laid therebetween, or the like. The amount of the gate capacitance depends on the capacitance used.

Each of the second transistor 103 and the third transistor 105 preferably has an extremely low off-state current. As off-state currents of the second transistor 103 and the third transistor 105 become lower, the gate capacitance of the first transistor 101 can hold electric charge for a longer time. The electric charge can be held for a long time even when electric power is not supplied to the memory circuit.

Each of the second transistor 103 and the third transistor 105 is preferably a transistor having an off-state current which is lower than that of a transistor using silicon as a semiconductor used for a channel. Specifically, a semiconductor whose band gap is wider than that of silicon as a semiconductor where a channel is formed is preferably used. For example, the semiconductor the band gap of which is more than 1.1 eV, preferably 2.5 eV or more and 4 eV or less, still preferably 3 eV or more and 3.8 eV or less is used. As one example of a semiconductor which has a band gap wider than that of a silicon semiconductor, a compound semiconductor such as silicon carbide (SiC) or gallium nitride (GaN), an oxide semiconductor formed of a metal oxide such as In—Ga—Zn—O-based oxide semiconductor, or the like can be used.

Further, the channel formation regions of the second transistor 103 and the third transistor 105 preferably use a semiconductor having an intrinsic carrier density lower than that of silicon. For example, the intrinsic carrier density of the oxide semiconductor is $10^{-9}/\text{cm}^3$, which is much smaller than that of silicon ($10^{11}/\text{cm}^3$).

Majority carriers of a transistor including an oxide semiconductor to the channel formation region flow only from a source of the transistor. Further, a channel formation region can be completely depleted. Thus, an off-state current of the transistor can be extremely low. The off-state current of the transistor including the oxide semiconductor can be as low as 10 yA/μm or less at room temperature, and 1 zA/μm or less at 85° C. to 95° C.

Note that a highly purified oxide semiconductor obtained by a reduction of impurities serving as electron donor (donor), such as moisture and hydrogen, and by a reduction of oxygen defects is an intrinsic (i-type) semiconductor or a substantially i-type semiconductor. Therefore, a transistor including the oxide semiconductor has a characteristic of extremely low off-state current. With the use of the oxide semiconductor film which is highly purified by sufficiently reducing the concentration of impurities such as moisture or hydrogen and by reducing oxygen defects, off-state current of the transistor can be low.

The hydrogen concentration of the highly purified oxide semiconductor layer, measured by secondary ion mass spectrometry (also referred to as SIMS), is $5\times10^{19}$ atoms/cm$^3$ or lower, preferably $5\times10^{18}$ atoms/cm$^3$ or lower, more preferably $5\times10^{17}$ atoms/cm$^3$ or lower.

In addition, the carrier concentration of the highly purified oxide semiconductor is preferably lower than $1\times10^{14}/\text{cm}^3$, more preferably lower than $1\times10^{12}/\text{cm}^3$, still preferably lower than $1\times10^{11}/\text{cm}^3$.

The memory circuit of one embodiment of the present invention has the first writing mode where data can be retained for a long time by using the capacitor 107 and the gate capacitance of the first transistor 101 and the second writing mode where data can be written at high speed by using the gate capacitance of the first transistor 101. The memory circuit of one embodiment of the present invention selects a capacitor part to retain data; as a result, data (even the large amount of data) which needs to be retained for a long time can be retained for a long time while data which needs to be written within a short time can be written at high speed.

Here, the capacitance of the capacitor 107 is preferably sufficiently higher than the gate capacitance of the first transistor 101.

Figure 1B:
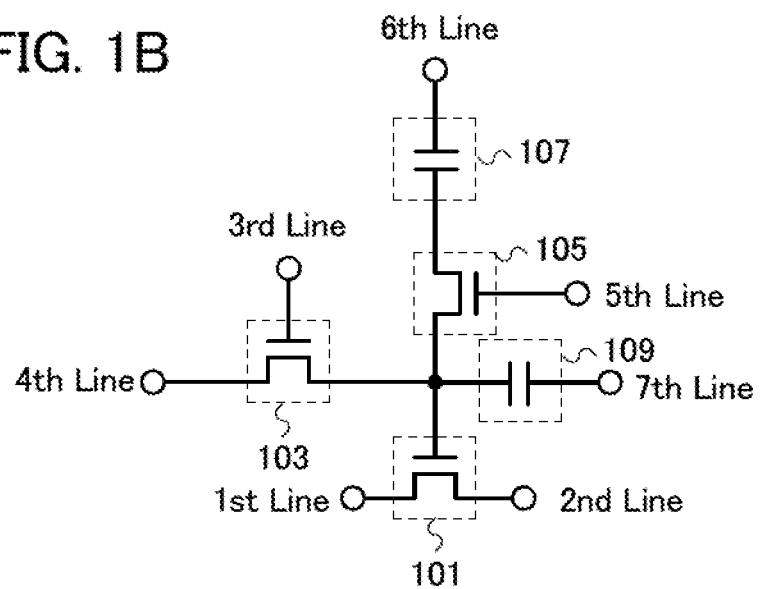

The memory circuit of one embodiment of the present invention may include a capacitor 109 as illustrated in FIG. 1B. One of electrodes of the capacitor 109 is electrically connected to the first gate electrode, the one of the second source electrode and the second drain electrode, and the one of the third source electrode and the third drain electrode. The other of the electrodes of the capacitor 109 is electrically connected to a seventh wiring (7th Line).

Note that the capacitance of the capacitor 109 is sufficiently lower than the capacitance of the capacitor 107.

In addition, the seventh wiring is a wiring to which a fixed potential is supplied and may have the same potential as the sixth wiring, for example.

<Operation of Memory Circuit>

Operation of the memory circuit illustrated in FIG. 1A will be described.

<<First Writing Mode>>

First, data writing, data retention, and data reading using the capacitor 107 and the gate capacitance of the first transistor 101 will be described. Here, a node where the one of the electrodes of the capacitor 107 and the other of the third source electrode and the third drain electrode are connected is denoted by node A. In addition, a node where the first gate electrode, the one of the second source electrode and the second drain electrode, and the one of the third source electrode and the third drain electrode are connected is denoted by node B. Note that in this embodiment, gate capacitance means the gate capacitance of the first transistor 101, otherwise specified.

[1-1: Writing data using Capacitor 107 and Gate Capacitance]

The potential of the third wiring is set to a potential at which the second transistor 103 is turned on and the potential of the fifth wiring is set at a potential at which the third transistor 105 is turned on, whereby the second transistor 103 and the third transistor 105 are turned on. Subsequently, a predetermined voltage is applied between the fourth wiring and the sixth wiring, so that electric charge is accumulated in the capacitor 107 and the gate capacitance; as a result, the potential is applied to the node A and the node B (data writing).

[1-2: Retaining data using Capacitor 107 and Gate Capacitance]

The potential of the third wiring is set to a potential at which the second transistor 103 is turned off and the potential of the fifth wiring is set to a potential at which the third transistor 105 is turned off, whereby the second transistor 103 and the third transistor 105 are turned off. Accordingly, the potentials applied to the node A and the node B are retained (data retention). Note that here, the second transistor 103 is turned off at the same time as or after the third transistor 105 is turned off.

Here, since off-state currents of the second transistor 103 and the third transistor 105 are extremely low, electric charge accumulated in the capacitor 107 and the gate capacitance is retained for a long time.

[1-3: Reading data using Capacitor 107 and Gate Capacitance]

In the case of reading data, a predetermined potential (constant potential) is applied to the first wiring. The potential of the fifth wiring is set to a potential at which the third transistor 105 is turned on, whereby the third transistor 105 is turned on. Here, the potential of the second wiring is changed when the node A retains a potential at which the first transistor 101 is turned on, whereas the potential of the second wiring is not changed when the node A retains a potential at which the first transistor 101 is turned off. That is, the data written to the memory circuit can be read by detecting a change in potential of the second wiring.

[1-4: Rewriting data using Capacitor 107 and Gate Capacitance]

Data can be rewritten by an operation similar to that of writing data and retaining data. The second transistor 103 and the third transistor 105 are turned on and a voltage relating to new data is applied between the fourth wiring and the sixth wiring, so that electric charge is accumulated in the capacitor 107 and the gate capacitance; as a result, a potential is applied to the node A and the node B (data writing). After that, the second transistor 103 and the third transistor 105 are turned off, whereby the potentials of the node A and the node B (potentials relating to new data) are retained.

When data is retained by using the capacitor 107 and the gate capacitance of the first transistor 101, data can be retained for a long time in comparison with the case where data is retained by using only the gate capacitance of the first transistor 101.

<<Second Writing Mode>>

Next, data writing, data retention, and data reading using only the gate capacitance of the first transistor 101 will be described.

[2-1: Writing data using Only Gate Capacitance]

The potential of the fifth wiring is set to a potential at which the third transistor 105 is turned off, whereby the third transistor 105 is turned off. The potential of the third wiring is set to a potential at which the second transistor 103 is turned on, whereby the second transistor 103 is turned on. Subsequently, a predetermined potential is applied to the fourth wiring, so that electric charge is accumulated in the gate capacitance; as a result, a potential is applied to the node B (data writing).

[2-2: Retaining Data using Only Gate Capacitance]

The potential of the third wiring is set to a potential at which the second transistor 103 is turned off, whereby the second transistor 103 is turned off. Accordingly, the potential applied to the node B is retained (data retention).

Here, since the off-state currents of the second transistor 103 and the third transistor 105 are extremely low, electric charge accumulated in the gate capacitance is retained for a long time.

[2-3: Reading Data Using Only Gate Capacitance]

In the case of reading data, a predetermined potential (constant potential) is applied to the first wiring. Here, the potential of the second wiring is changed when the node B retains a potential at which the first transistor 101 is turned on, whereas the potential of the second wiring is not changed when the node B retains a potential at which the first transistor 101 is turned off. That is, the data written to the memory circuit can be read by detecting a change in potential of the second wiring.

[2-4: Rewriting Data Using Only Gate Capacitance]

Data can be rewritten by an operation similar to that of writing data and retaining data. The second transistor 103 is turned on (the third transistor 105 is in an off state) and a potential relating to new data is applied to the fourth wiring, so that electric charge is accumulated in the gate capacitance; as a result, a potential is applied to the node B (data writing). After that, the second transistor 103 is turned off, whereby the potential of the node B (potentials relating to new data) is retained.

That is, in the memory circuit of one embodiment of the present invention, data can be directly rewritten by writing data again. For that reason, an erasing operation which is necessary for a flash memory or the like is not needed, so that a reduction in operation speed and an increase in power consumption because of an erasing operation can be prevented.

In particular, when data is retained by using only the gate capacitance, data can be written at high speed in comparison with the case where data is retained by using both the gate capacitance and the capacitor 107.

<Calculation Example of Retention Time and Write Time>

Calculation examples of time during which data can be retained and time for writing data by using the gate capacitance of the first transistor 101 are shown. The following description is the description in the case where the second transistor 103 and the third transistor 105 include an oxide semiconductor in the channel formation regions, a gate insulating film of the first transistor 101 includes a silicon oxide film having a thickness x of 10 nm, and the first transistor 101 has a channel length L of 1 μm and a channel length W of 1 μm.

Capacitance C of the Gate Insulating Film Provided Between the First Gate electrode and a semiconductor layer is $3.45 \times 10^{-15}$ F (i.e., 3.45 fF) as shown by Equation 1. Note that in Equation 1, $\epsilon$ represents dielectric constant of the gate insulating film and $\epsilon_0$ represents vacuum dielectric constant.

[Equation 1]

$$C = \frac{\epsilon \epsilon_0 LW}{x} = \frac{3.9 \times 8.85 \times 10^{-12} \times 10^{-6} \times 10^{-6}}{10 \times 10^{-9}} = 3.45 \times 10^{-15} \quad (1)$$

When the off-state current $I_{off}$ of each of the second transistor 103 and the third transistor 105 is 10 yA and a gate voltage (retention voltage) V at the time of retaining data by using only the gate capacitance of the first transistor 101 is 3 V, time $t_1$ from the start of data retention until retained electric charge is reduced by 10% is $5.175 \times 10^7$ s, that is more than one and half years, as shown by Equation 2. Note that in the case of retain data by using also the capacitor 107, time until retained electric charge is reduced by 10% is longer than $t_1$ because the capacitance is larger than the gate capacitance of the first transistor 101.

[Equation 2]

$$t_1 = \frac{CV}{2I_{off}} = \frac{3.45 \times 10^{-15} \times 3}{2 \times 100 \times 10^{-24}} = 5.175 \times 10^7 \quad (2)$$

When the on-state current $I_{on}$ of the second transistor 103 is 5 μA, time $t_2$ for writing electric charge corresponding to data to only the gate capacitance of the first transistor 101 is $2.07 \times 10^{-9}$ s, that is, 2.07 ns.

[Equation 3]

$$t_2 = \frac{CV}{I_{on}} = \frac{3.45 \times 10^{-15} \times 3}{5 \times 10^{-6}} = 2.07 \times 10^{-9} \quad (3)$$

As described above, it is shown that in the memory circuit of one embodiment of the present invention which includes the second transistor 103 and the third transistor 105 each of which includes an oxide semiconductor in a channel formation region, data can be retained for a long time and data can be written at high speed by using the gate capacitance.

<Oxide Semiconductor>

The memory circuit of one embodiment of the present invention includes a transistor including an oxide semiconductor in a channel formation region. An oxide semiconductor will be described below.

The oxide semiconductor is in a single crystal state, a polycrystalline (also referred to as polycrystal) state, an amorphous state, or the like.

In the case of an oxide semiconductor in an amorphous state, a flat surface can be obtained with relative ease. Therefore, interface scattering of carriers (electrons) of a transistor including such an oxide semiconductor at the time of operation can be reduced, so that high field-effect mobility can be obtained with relative ease.

In the case of a crystalline oxide semiconductor, defects in the bulk can be further reduced. The field-effect mobility of a transistor including the oxide semiconductor having crystallinity and high surface planarity can be higher than that of a transistor including an oxide semiconductor in an amorphous state. In order to obtain a high surface planarity, the oxide semiconductor is preferably formed over a flat surface.

An oxide semiconductor may include a non-single-crystal part, for example. The non-single-crystal part includes, for example, at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, the oxide semiconductor film may include a CAAC-OS. In the CAAC-OS, for example, c-axes are aligned, and a-axes and/or b-axes are not macroscopically aligned.

For example, an oxide semiconductor film may include microcrystal. An oxide semiconductor film including microcrystal (also referred to as a microcrystalline oxide semiconductor film) includes microcrystal with a size greater than or equal to 1 nm and less than 10 nm (also referred to as nanocrystal), for example.

For example, an oxide semiconductor film may include an amorphous part. Note that an oxide semiconductor film including an amorphous part (also referred to as an amorphous oxide semiconductor film), for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked-layer structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

In one embodiment of the present invention, a semiconductor layer including an oxide semiconductor is preferably a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed. Thus, in the CAAC-OS film, a reduction in electron mobility, due to the grain boundary, is prevented.

In each of the crystal parts included in the CAAC-OS film, for example, a c-axis is aligned in a direction parallel to a normal vector of a surface where the CAAC-OS film is formed or a normal vector of a surface of the CAAC-OS film.

Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is sometimes higher than that in the vicinity of the surface where the oxide semiconductor film is formed. Further, when an impurity is added to the CAAC-OS film, crystallinity of the crystal part in a region to which the impurity is added is lowered in some cases.

The c-axes of the crystal parts included in the CAAC-OS film are aligned in the direction parallel to a normal vector of a surface where the CAAC-OS film is formed or a normal vector of a surface of the CAAC-OS film; thus, the directions of the c-axes may be different from each other depending on the shape of the CAAC-OS film (the cross-sectional shape of the surface where the CAAC-OS film is formed or the cross-sectional shape of the surface of the CAAC-OS film). Note that the crystal parts are formed in the film deposition or in crystallization treatment, such as heat treatment, performed after the film deposition. Hence, the c-axes of the crystal parts are aligned in the direction parallel to a normal vector of the surface where the CAAC-OS film is formed or a normal vector of the surface of the CAAC-OS film.

With use of the CAAC-OS film, change in electric characteristics of a transistor due to irradiation with visible light or ultraviolet light can be reduced, so that a highly reliable transistor can be obtained.

An oxide semiconductor to be used preferably contains at least indium (In) or zinc (Zn). In particular, both of In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

In addition, as other stabilizer(s), the oxide semiconductor may contain one or more of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

As described above, in the memory circuit of one embodiment of the present invention, data which needs to be retained for a long time can be retained for a long time while data which needs to be written within a short time can be written at high speed. The mode of the memory circuit of one embodiment of the present invention can be switched as appropriate between a mode in which high-speed operation is performed and a mode in which data is retained for a long time.

This embodiment can be combined with any of the other embodiments as appropriate.

(Embodiment 2)

Figure 2:
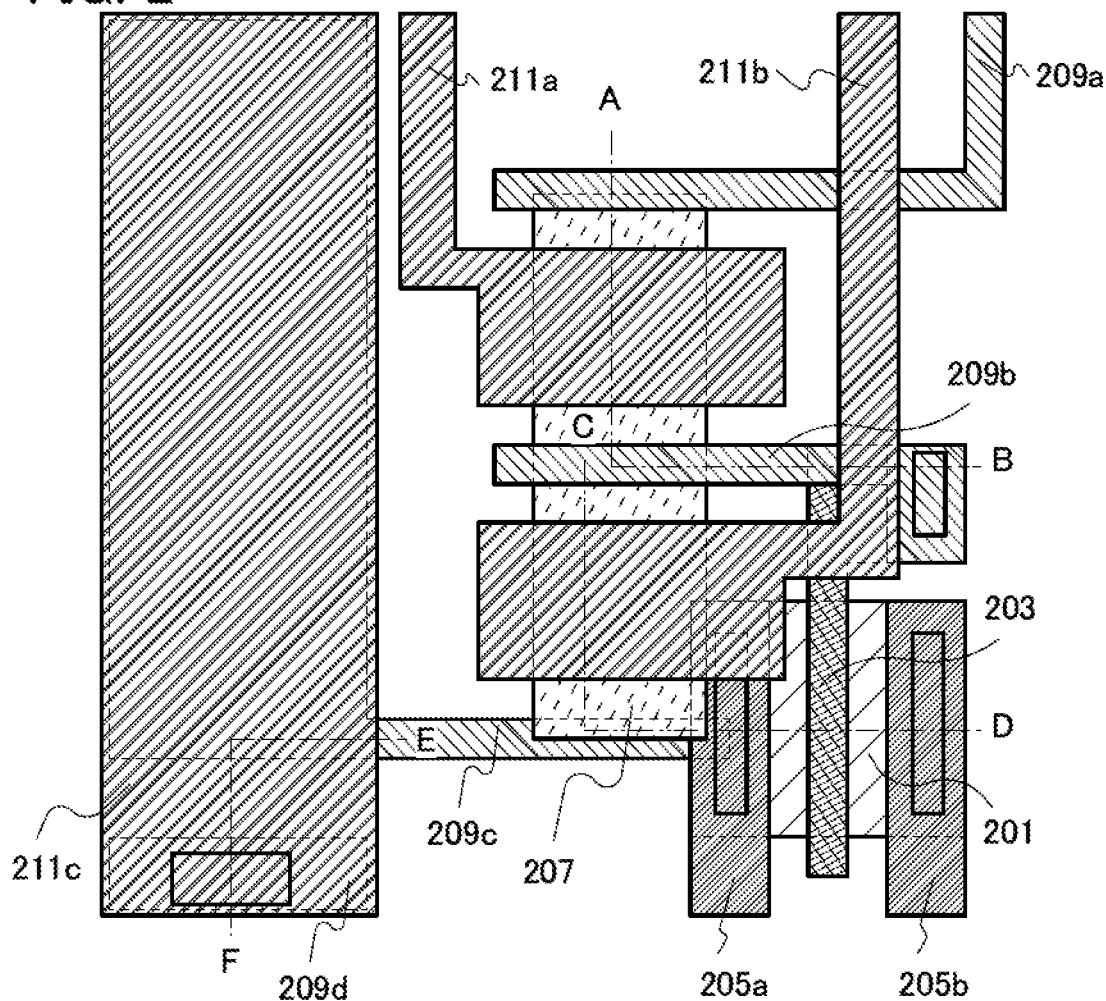
FIG. 2 is a schematic plan view illustrating a memory circuit of one embodiment of the present invention.
Figure 3A:
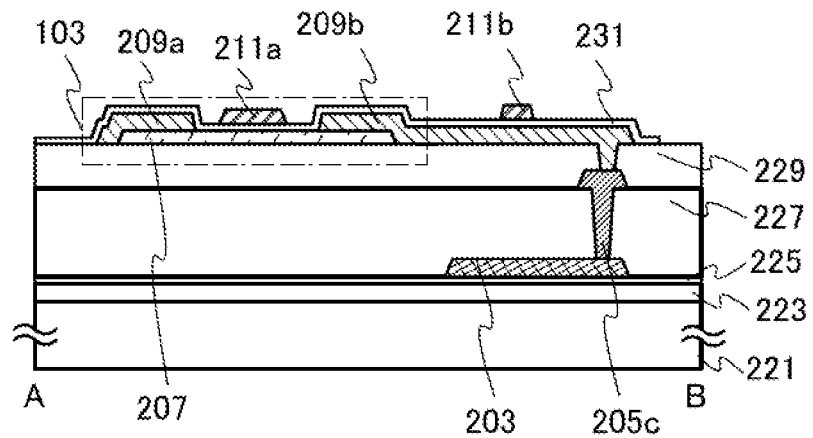
FIGS. 3A to 3C are schematic cross-sectional views illustrating a memory circuit of one embodiment of the present invention.
Figure 3B:
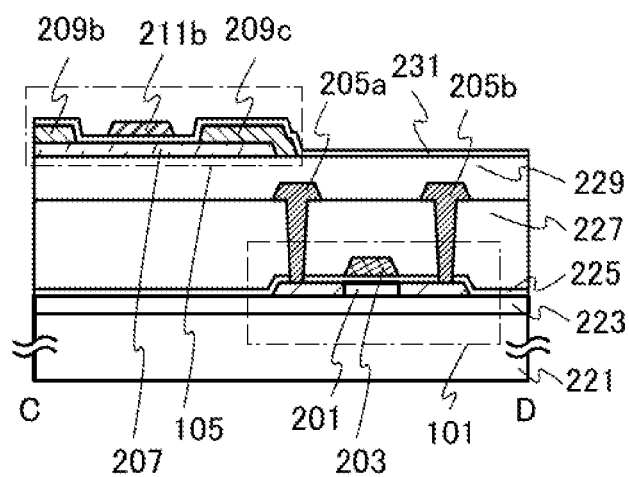
Figure 3C:
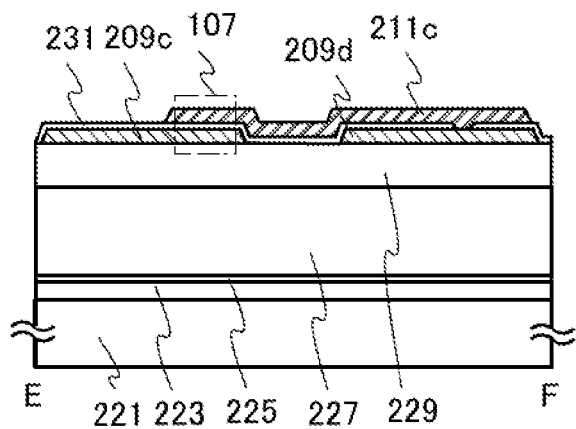

In this embodiment, a method for manufacturing a memory circuit of one embodiment of the present invention will be described with reference to FIG. 2, FIGS. 3A to 3C, and FIGS. 4A to 4E. FIG. 2 illustrates one example of a plan view of the memory circuit of one embodiment of the present invention. FIGS. 3A to 3C illustrate a cross-sectional view taken along line A-B in FIG. 2, a cross-sectional view taken along line C-D in FIG. 2, and a cross-sectional view taken along line E-F in FIG. 2, respectively. Note that a circuit diagram of a memory circuit in this embodiment corresponds to FIG. 1A.

First, the first transistor 101 which is an n-channel transistor is formed over a substrate 221. Here, as one example, the first transistor 101 which is an n-channel transistor is formed using a single crystal semiconductor film which is separated from a single crystal semiconductor substrate.

The first transistor 101 illustrated in FIG. 3B includes a gate electrode 203. The first transistor 101 has a semiconductor layer 201 including a pair of regions that have n-type conductivity and sandwiches a region overlapping with the gate electrode 203. In addition, the first transistor 101 includes a gate insulating film 225 between the semiconductor layer 201 and the gate electrode 203.

Specifically, an example of a manufacturing method of the single crystal semiconductor film will be briefly described. First, an ion beam including ions which are accelerated by an electric field enters the single crystal semiconductor substrate, so that a fragile layer which is weakened by local disorder of the crystal structure is formed in a region at a certain depth from the surface of the semiconductor substrate. The depth at which the fragile layer is formed can be adjusted by the acceleration energy of the ion beam and the incidence angle of the ion beam. Then, the semiconductor substrate and the substrate 221 over which the insulating film 223 is formed are attached to each other so that the insulating film 223 is provided therebetween. To attach the substrates, the semiconductor substrate and the substrate 221 overlap with each other, and then a pressure of approximately 1 N/cm$^2$ to 500 N/cm$^2$, preferably 11 N/cm$^2$ to 20 N/cm$^2$ is applied to part of the semiconductor substrate and the substrate 221. When the pressure is applied, bonding between the semiconductor substrate and the insulating film 223 starts from the portion to which the pressure is applied, which results in bonding of the entire surface where the semiconductor substrate and the insulating film 223 are in close contact with each other. Subsequently, heat treatment is performed, whereby very small voids that exist in the fragile layer are combined, so that the very small voids increase in volume. As a result, the single crystal semiconductor film which is part of the semiconductor substrate is separated from the semiconductor substrate along the fragile layer. The heat treatment is performed at a temperature not exceeding the strain point of the substrate 221. Then, the single crystal semiconductor film is processed into a desired shape by etching or the like, so that an island-shaped semiconductor layer 201 can be formed.

Note that although an example in which the first transistor 101 is formed using a single crystal semiconductor film is described in this embodiment, the present invention is not limited to this structure. For example, a polycrystalline or microcrystalline semiconductor film which is formed over the insulating film 223 by vapor deposition may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. In the case where a heat-resistant substrate such as a quartz substrate is used, it is possible to use a combination of any of the following crystallization methods: a thermal crystallization method using an electrically heated oven, a lamp annealing crystallization method using infrared light, a crystallization method using a catalytic element, and a high-temperature annealing method at approximately 950° C.

The first transistor 101 can be formed using a semiconductor material such as silicon, germanium, silicon germanium, or single crystal silicon carbide. For example, the first transistor 101 including silicon can be formed using a single crystal semiconductor substrate such as a silicon wafer, a silicon thin film which is formed by an SOI method, a silicon thin film which is formed by a vapor deposition method, or the like.

Although there is no particular limitation on a material which can be used as the substrate 221, it is necessary that the material have at least heat resistance high enough to withstand heat treatment to be performed later. For example, a glass substrate formed by a fusion process or a float process, a quartz substrate, a ceramic substrate, or the like can be used as the substrate 221. As the glass substrate, the one whose strain point is 730° C. or higher may be used in the case where the heat treatment is performed at a high temperature in a later step. Although a substrate formed of a flexible synthetic resin such as plastic generally has a resistance temperature lower than that of the aforementioned substrates, it may be used as long as being resistant to a processing temperature during manufacturing steps.

Next, an insulating film 227 is formed to cover the first transistor 101. After that, the gate insulating film 225 and the insulating film 227 are partly etched to form contact holes reaching the gate electrode 203 and the pair of regions in the semiconductor layer 201 that have n-type conductivity. Then, a conductive film is formed over the insulating film 227 by a sputtering method or a vacuum evaporation method, and then the conductive film is patterned by etching or the like, so that conductive layers 205a and 205b which are electrically connected to the pair of regions that have n-type conductivity and a conductive layer 205c which is electrically connected to the gate electrode 203 are formed. Further, an insulating film 229 is formed so as to cover the conductive layers 205a to 205c.

Each of the insulating films 227 and 229 may have a single-layer structure or a stacked-layer structure. The insulating films 227 and 229 may have its surface planarized by a CMP method or the like. With the use of the planarized insulating films 227 and 229, variation in electrical characteristics of a transistor including an oxide semiconductor layer which is formed later can be reduced. Further, the transistor including an oxide semiconductor layer can be manufactured with a high yield.

The insulating films 227 and 229 are formed using materials which can withstand temperature of heat treatment performed in a later manufacturing step. Examples of materials for the insulating films 227 and 229 are silicon oxide, silicon nitride, silicon nitride oxide, silicon oxynitride, aluminum nitride, aluminum oxide, gallium oxide, aluminum oxynitride, hafnium oxide, magnesium oxide, zirconium oxide, lanthanum oxide, barium oxide film, and the like.

Note that, in this specification, an oxynitride refers to a material containing a larger amount of oxygen than that of nitrogen, and a nitride oxide compound refers to a material containing a larger amount of nitrogen than that of oxygen.

It is preferable that the insulating film 229 which is in contact with an oxide semiconductor layer 207 formed in a later step contains impurities such as moisture, hydrogen, or oxygen as little as possible. When hydrogen is contained in the insulating film 229, hydrogen enters the oxide semiconductor layer or oxygen in the oxide semiconductor layer is extracted by hydrogen, whereby a back channel portion of the oxide semiconductor layer has lower resistance (n-type conductivity) and a parasitic channel might be formed. It is therefore important to employ a deposition method in which hydrogen is not used in order to form the insulating film 229 containing hydrogen as little as possible.

The aluminum oxide film can be preferably employed because of a high shielding effect (blocking effect) which enables impermeability of both oxygen and impurities such as hydrogen and moisture; and in and after the manufacturing process, the aluminum oxide film functions as a protective film for preventing entry of an impurity such as hydrogen or moisture, which causes a change in characteristics, into the oxide semiconductor layer 207 and release of oxygen, which is a main constituent material of the oxide semiconductor, from the oxide semiconductor layer 207.

The insulating film 229 preferably include oxygen in a portion which is in contact with the oxide semiconductor layer 207. In particular, it is preferable that the oxygen content of the insulating film 229 in (a bulk of) the film is in excess of that in the stoichiometric composition. For example, in the case where a silicon oxide film is used as the insulating film 229, the composition formula thereof is preferably $SiO_{2+\alpha}$ ($\alpha>0$). With the use of the silicon oxide film as the insulating film 229, oxygen can be supplied to the oxide semiconductor layer 207 and excellent electric characteristics can be obtained.

In the case where the insulating film 229 has a stacked-layer structure, a stacked-layer structure of an oxide insulating film in contact with the oxide semiconductor layer 207 and an insulating film which is in contact with the oxide insulating film and has a high barrier property is preferable. For example, a silicon nitride film, a silicon nitride oxide film, an aluminum nitride film, an aluminum nitride oxide film, or the like can be used as the insulating film having a high barrier property. When the insulating film having a high barrier property is used, impurities such as moisture or hydrogen can be prevented from entering the oxide semiconductor layer 207, or the like.

As a material of the conductive layers 205a to 205c, an element selected from aluminum, chromium, copper, tantalum, titanium, molybdenum, and tungsten, an alloy containing any of these elements as a component, an alloy containing any of these elements in combination, or the like can be given. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

The conductive layers 205a to 205c may have a single-layer structure or a stacked-layer structure of two or more layers. For example, a single-layer structure of an aluminum film containing silicon; a two-layer structure of an aluminum film and a titanium film stacked thereover; a three-layer structure in which a titanium film, an aluminum film, and a titanium film are stacked in this order; and the like can be given.

Alternatively, the conductive layers 205a to 205c may be formed using conductive metal oxide. As the conductive metal oxide, indium oxide, tin oxide, zinc oxide, an indium tin oxide, indium zinc oxide, or the metal oxide material containing silicon or silicon oxide can be used.

In the case where heat treatment is performed after formation of the conductive film, the conductive film preferably has heat resistance high enough to withstand the heat treatment.

Next, the oxide semiconductor layer 207 is formed over the insulating film 229. The above embodiment can be referred to for the oxide semiconductor.

The oxide semiconductor layer 207 may have either a single-layer structure or a stacked-layer structure. Further, the oxide semiconductor layer 207 may have an amorphous structure or be a crystalline oxide semiconductor. In the case where the oxide semiconductor layer 207 has an amorphous structure, heat treatment may be performed on the oxide semiconductor layer in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

The oxide semiconductor layer 207 can be formed by a sputtering method, a molecular beam epitaxy (MBE) method, a CVD method, a pulse laser deposition method, an atomic layer deposition (ALD) method, or the like as appropriate. The oxide semiconductor layer 207 may be formed using a sputtering apparatus which performs film formation with surfaces of a plurality of substrates set substantially perpendicular to a surface of a sputtering target.

In the formation of the oxide semiconductor layer 207, the concentration of hydrogen contained in the oxide semiconductor layer 207 is preferably reduced as much as possible. In order to reduce the hydrogen concentration, for example, in the case where a sputtering method is used for the deposition, a high-purity rare gas (typically, argon) from which impurities such as hydrogen, water, a hydroxyl group, and hydride have been removed; oxygen; or a mixed gas of oxygen and the rare gas is used as appropriate as an atmosphere gas supplied to a process chamber of a sputtering apparatus.

The oxide semiconductor layer is formed in such a manner that a sputtering gas from which hydrogen and moisture are removed is introduced into a deposition chamber while moisture remaining in the deposition chamber is removed, whereby the concentration of hydrogen in the oxide semiconductor layer can be reduced. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. The cryopump has a high capability in removing a hydrogen molecule, a compound containing a hydrogen atom such as water ($H_2O$) (further preferably, also a compound containing a carbon atom), and the like; thus, the impurity concentration in the oxide semiconductor layer 207 formed in the deposition chamber which is evacuated with the cryopump can be reduced.

Further, when the oxide semiconductor layer 207 is deposited by a sputtering method, the relative density (filling rate) of a metal oxide target that is used for the deposition is greater than or equal to 90% and less than or equal to 100%, preferably greater than or equal to 95% and less than or equal to 99.9%. With the use of a metal oxide target with a high relative density, a dense oxide semiconductor layer can be deposited.

Further, for reducing the impurity concentration in the oxide semiconductor layer 207, it is also effective to form the oxide semiconductor layer 207 while the substrate 221 is kept at high temperature. The temperature at which the substrate 221 is heated may be higher than or equal to 150° C. and lower than or equal to 450° C.; the substrate temperature is preferably higher than or equal to 200° C. and lower than or equal to 350° C. The crystalline oxide semiconductor layer can be formed by heating the substrate at a high temperature in the formation.

The oxide semiconductor layer 207 is preferably formed under a condition such that much oxygen is contained (for example, by a sputtering method in an atmosphere where the proportion of oxygen is 100%) so as to be a film containing much oxygen (preferably including a region containing oxygen in excess of the stoichiometric composition of the oxide semiconductor in a crystalline state).

A high-purity gas from which impurities such as hydrogen, water, hydroxyl groups, or hydride have been removed is preferably used as a sputtering gas for forming the oxide semiconductor layer 207.

There are three methods for obtaining a CAAC-OS film when the CAAC-OS film is used as the oxide semiconductor layer 207. The first method is to form an oxide semiconductor layer at a film formation temperature higher than or equal to 200° C. and lower than or equal to 450° C., thereby obtaining c-axis alignment substantially perpendicular to a surface. The second method is to form a thin oxide semiconductor layer and then subject the layer to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

An oxide semiconductor film which is formed is processed by a photolithography process so as to form the island-shaped oxide semiconductor layer 207. A resist mask for processing the oxide semiconductor layer into the island-shaped oxide semiconductor layer 207 may be formed by an inkjet method. Formation of the resist mask by ink jetting needs no photomask; thus, manufacturing cost can be reduced.

Further, the oxide semiconductor layer 207 is preferably subjected to heat treatment for removing excess hydrogen (including water and a hydroxyl group) contained in the oxide semiconductor layer 207 (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an n-type impurity, can be removed from the oxide semiconductor by the heat treatment. For example, the hydrogen concentration in the oxide semiconductor layer 207 after the dehydration or dehydrogenation treatment can be lower than or equal to $5 \times 10^{19}/cm^3$, preferably lower than or equal to $5 \times 10^{18}/cm^3$.

Note that the heat treatment for the dehydration or dehydrogenation may be performed at any timing in the manufacturing process of the transistor as long as the heat treatment is performed after the formation of the oxide semiconductor layer. Further, the heat treatment for the dehydration or dehydrogenation may be performed plural times, and may also serve as another heat treatment.

For preventing release of oxygen due to the heat treatment from the insulating film 229, the heat treatment for the dehydration or dehydrogenation is preferably performed before the oxide semiconductor layer 207 is processed into an island shape.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor layer 207 is heated in the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, and the like be not contained in the oxygen gas or the dinitrogen monoxide gas. Alternatively, the purity of the oxygen gas or the dinitrogen monoxide gas which is introduced into the heat treatment apparatus is preferably 6N or higher, more preferably 7N or higher (i.e., the impurity concentration in the oxygen gas or the dinitrogen monoxide gas is preferably 1 ppm or lower, more preferably 0.1 ppm or lower). The oxygen gas or the dinitrogen monoxide gas acts to supply oxygen that is a main constituent material of the oxide semiconductor and that is reduced by the step for removing impurities for dehydration or dehydrogenation, so that the oxide semiconductor layer 207 can be a highly-purified, i-type (intrinsic) oxide semiconductor layer.

Further or alternatively, after the oxide semiconductor layer 207 is subjected to the dehydration or dehydrogenation treatment, oxygen (which includes at least one of an oxygen radical, an oxygen atom, and an oxygen ion) may be introduced into the oxide semiconductor layer 207 to supply oxygen to the oxide semiconductor layer 207. Through this step, the oxide semiconductor layer 207 can be highly purified and made to be an i-type (intrinsic) oxide semiconductor.

Variation in electric characteristics of a transistor having the highly-purified and electrically i-type (intrinsic) oxide semiconductor layer 207 is prevented, and the transistor is electrically stable.

Oxygen may be directly introduced into the oxide semiconductor layer 207 or introduced into the oxide semiconductor layer 207 through another film such as a gate insulating film 231 formed later. An ion implantation method, an ion doping method, a plasma immersion ion implantation method, or the like may be employed in the case where oxygen is introduced through another film, whereas plasma treatment or the like can be employed in addition to the above methods in the case where oxygen is directly introduced to the oxide semiconductor layer 207 in an exposed state.

The addition of oxygen into the oxide semiconductor layer 207 can be performed anytime after dehydration or dehydrogenation treatment is performed thereon. Further, oxygen may be introduced plural times into the oxide semiconductor layer 207 subjected to the dehydration or dehydrogenation treatment.

Next, the insulating film 229 is partly etched to form a contact hole reaching the conductive layer 205c. A conductive film is formed so as to cover the oxide semiconductor layer 207 by sputtering or vacuum evaporation. Then, the conductive film is patterned by etching or the like, so that conductive layers 209a to 209d each of which functions as a source electrode, a drain electrode, or a wiring are formed.

Note that the conductive layers 209a to 209c are in contact with the oxide semiconductor layer 207. Further, the conductive layer 209b is electrically connected to the conductive layer 205c.

The conductive layers 209a to 209d can be formed using a material and method which are similar to those of the conductive layers 205a to 205c.

Note that when the conductive film is etched, materials and etching conditions are adjusted as appropriate so that the oxide semiconductor layer 207 is removed as little as possible. Depending on the etching conditions, there are some cases in which an exposed portion of the island-shaped oxide semiconductor layer 207 is partly etched and thereby a groove (a depression portion) is formed.

In order to reduce the number of photomasks and steps in a photolithography process, etching may be performed with the use of a resist mask formed using a multi-tone mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

After that, plasma treatment using a gas such as $N_2O$, $N_2$, and Ar is preferably conducted. By this plasma treatment, water or the like adhering to an exposed surface of the oxide semiconductor layer 207 is removed. Alternatively, plasma treatment may be performed using a mixed gas of oxygen and argon.

Next, the gate insulating film 231 is formed to cover the conductive layers 209a to 209d.

The gate insulating film 231 can be formed by a sputtering method, an MBE method, a CVD method, a pulse laser deposition method, an ALD method, or the like to have a thickness greater than or equal to 1 nm and less than or equal to 20 nm. The gate insulating film 231 may be formed using a sputtering apparatus which performs film formation with surfaces of a plurality of substrates set substantially perpendicular to a surface of a sputtering target.

The gate insulating film 231 can be made of silicon oxide, gallium oxide, aluminum oxide, silicon nitride, silicon oxynitride, aluminum oxynitride, silicon nitride oxide, or the like. It is preferable that the gate insulating film 231 include oxygen in a portion which is in contact with the oxide semiconductor layer 207. In particular, it is preferable that the oxygen content of the gate insulating film 231 in (a bulk of) the film be in excess of that in the stoichiometric composition. For example, in the case where a silicon oxide film is used as the gate insulating film 231, the composition formula thereof is preferably $SiO_{2+\alpha}$ ($\alpha$>0). In this embodiment, a silicon oxide film of $SiO_{2+\alpha}$ ($\alpha$>0) is used as the gate insulating film 231. By using the silicon oxide film as the gate insulating film 231, oxygen can be supplied to the oxide semiconductor layer 207, leading to good characteristics. Further, the gate insulating film 231 is preferably formed in consideration of the size of a transistor to be formed and the step coverage with the gate insulating film 231.

The gate insulating film 231 can be formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, whereby gate leakage current can be reduced. Further, the gate insulating film 231 may have either a single-layer structure or a stacked-layer structure.

After the gate insulating film 231 is formed, heat treatment may be performed. The heat treatment is performed in a nitrogen atmosphere, an atmosphere of ultra-dry air, or a rare gas (e.g., argon, helium) atmosphere preferably at a temperature in the range of 200° C. to 400° C., for example, 250° C. to 350° C. It is preferable that the water content in the gas be 20 ppm or less, preferably 1 ppm or less, further preferably 10 ppb or less. In this embodiment, the heat treatment is performed under a nitrogen atmosphere at 250° C. for an hour. Alternatively, RTA treatment for a short time at a high temperature may be performed in a manner similar to that of the heat treatment performed on the oxide semiconductor layer for reduction of moisture or hydrogen. Even when oxygen defects are generated in the oxide semiconductor layer 207 because of the previous heat treatment performed on the oxide semiconductor layer, heat treatment is performed after the gate insulating film 231 containing oxygen is provided, so that oxygen is supplied to the oxide semiconductor layer 207 from the gate insulating film 231. The supply of oxygen to the oxide semiconductor layer 207 results in a reduction in oxygen defects that serve as donors and are in the oxide semiconductor layer 207. As a result, the oxide semiconductor layer 207 can be made substantially i-type and variation in electrical characteristics of the transistor due to oxygen defects can be reduced, which results in improvement of electrical characteristics. There is no particular limitation on the timing of this heat treatment as long as it is after the formation of the gate insulating film 231. When this heat treatment also serves as heat treatment in another step (e.g., heat treatment at the time of formation of a resin film or heat treatment for lowering the resistance of a transparent conductive film), the oxide semiconductor layer 207 can be made substantially i-type without an increase in the number of steps.

Further, oxygen defects that serve as donors in the oxide semiconductor layer 207 may be reduced by performing heat treatment on the oxide semiconductor layer 207 in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 207 by an ion implantation method, an ion doping method, or the like so that oxygen defects that serve as donors may be reduced. For example, oxygen made to be plasma with a microwave of 2.45 GHz may be added to the oxide semiconductor layer 207.

Next, the gate insulating film 231 is partly etched to form a contact hole reaching the conductive layer 209d. Then, a conductive film is formed so as to cover the conductive layers 209a to 209d by sputtering or vacuum evaporation. After that, the conductive film is patterned by etching or the like, so that conductive layers 211a to 211c each of which functions as a gate electrode or a wiring are formed.

The conductive layers 211a to 211c may have either a single-layer structure or a stacked-layer structure. For example, the conductive layers 211a to 211c can be formed using a metal material containing an element selected from molybdenum, titanium, tantalum, tungsten, aluminum, copper, chromium, neodymium, and scandium or metal nitride containing any of the above elements as its component (e.g., titanium nitride, molybdenum nitride, or tungsten nitride) can be used.

The conductive layers 211a to 211c can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the conductive layers 211a to 211c may have a stacked-layer structure of the above conductive material and the above metal material.

Further, a material the work function of which is higher than the work function of an oxide semiconductor preferably by 1 eV (electron volt) or more is used for the conductive layers 211a to 211c which are in contact with the gate insulating film 231. As a film including such a material, a film including a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (e.g., an indium nitride film, a zinc nitride film, a tantalum nitride film, and a tungsten nitride film) can be used. In the case where the conductive layer has a stacked-layer structure, such a material is preferably used for a layer in contact with the gate insulating film 231 in particular. The above films each have a work function of 5 eV or higher which enables the threshold voltage of the transistor to take a positive value when used as the gate electrode, so that a switching element of what is called normally-off type can be achieved.

Note that an insulating film to cover the conductive layers 211a to 211c may be further provided.

Through the above steps, the second transistor 103, the third transistor 105, and the capacitor 107 are formed.

Note that the structure of the first transistor 101 illustrated in FIG. 1A is not limited to the above structure. Another structure which can be applied to the first transistor 101 will be described with reference to FIGS. 4A to 4E.

First, element isolation regions 253 are formed in a p-type semiconductor substrate 251 (FIG. 4A).

As the p-type semiconductor substrate 251, a single crystal silicon substrate (a silicon wafer) having p-type conductivity or a compound semiconductor substrate (e.g., a SiC substrate, or a GaN substrate) can be used.

The element isolation regions 253 are formed by a LOCOS (local oxidation of silicon) method, an STI (shallow trench isolation) method, or the like.

In the case where a p-channel transistor is formed over the same substrate, an n-well region may be formed in part of the p-type semiconductor substrate 251. The n-well region is formed by addition of an impurity element imparting n-type conductivity, such as phosphorus or arsenic.

Although the p-type semiconductor substrate is used here, a p-channel transistor may be formed using an n-type semiconductor substrate. In that case, a p-well region which is formed by addition of an impurity element imparting p-type conductivity, such as boron, may be formed in the n-type semiconductor substrate and an n-channel transistor may be formed over the same substrate.

Next, a gate insulating film 257 and a gate electrode 259 are formed over the semiconductor substrate 251 (FIG. 4A).

As the gate insulating film 257, a silicon oxide film can be formed by oxidation of a surface of the semiconductor substrate 251 with heat treatment. Alternatively, a silicon oxide film is formed by a thermal oxidation method, and then a surface of the silicon oxide film is nitrided by a nitridation treatment; thus a stacked structure including the silicon oxide film and the silicon film containing oxygen and nitrogen (silicon oxynitride film) is formed. Alternatively, the gate insulating film 207a and the insulating film 207b may be formed in such a manner that silicon oxide, silicon oxynitride, a metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to have a thickness of 5 nm to 50 nm by a CVD method, a sputtering method, or the like.

The gate electrode 259 is preferably formed using a metal such as tantalum, tungsten, titanium, molybdenum, chromium, or niobium or an alloy material or a compound material containing any of the metals as its main component. Further, polycrystalline silicon to which an impurity element such as phosphorus is added can be used. Alternatively, the gate electrode 259 may have a stacked structure including a metal nitride film and a film of any of the above metals. As the metal nitride, tungsten nitride, molybdenum nitride, or titanium nitride can be used. When the metal nitride film is provided, adhesiveness of the metal film can be increased; accordingly, separation can be prevented.

The gate electrode 259 is formed in such a manner that a conductive film is formed by a sputtering method, a CVD method, or the like and then part of the conductive film is selectively etched.

Note that in terms of higher integration, it is preferable that a sidewall insulating layer be not provided on a side surface of the gate electrode 259. On the other hand, when the characteristics of the transistor have priority, sidewall insulating layers may be provided on the side surfaces of the gate electrode 259.

Next, as illustrated in FIG. 4B, an impurity element imparting n-type conductivity is added to the semiconductor substrate 251 to form a region 261a which has n-type conductivity, the region 261b which has n-type conductivity. In the case where an n-well region is formed in the same substrate, an impurity element imparting p-type conductivity is added to the n-well region to form regions that have p-type conductivity. The concentration of the impurity element imparting n-type conductivity in the region 261a which has n-type conductivity and the region 261b which has n-type conductivity and the concentration of the impurity element imparting p-type conductivity in the regions that have p-type conductivity preferably range from $1 \times 10^{19}/cm^3$ to $1 \times 10^{21}/cm^3$. The impurity element imparting n-type conductivity and the impurity element imparting p-type conductivity are added to the n-well region and the semiconductor substrate 251, respectively, by an ion doping method, an ion implantation method, or the like as appropriate.

In the case where sidewall insulating layers are formed on the side surfaces of the gate electrode 259, regions overlapping with the sidewall insulating layers can have an impurity concentration different from that in the region 261a which has n-type conductivity, the region 261b which has n-type conductivity, and a region that has p-type conductivity.

Next, as illustrated in FIG. 4C, an insulating film 265 is formed over the semiconductor substrate 251, the element isolation regions 253, the gate insulating film 257, and the gate electrode 259 by a sputtering method, a CVD method, or the like.

The insulating film 265 may be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 265 is formed by a CVD method, a hydrogen content of the insulating film 265 can be increased. When such an insulating film 265 is used and heat treatment is performed, the semiconductor substrate is hydrogenated and dangling bonds are terminated with hydrogen, which leads to a reduction in defects in the semiconductor substrate.

Next, after the insulating film 265 is formed, heat treatment is performed to activate the impurity elements added to the region 261a which has n-type conductivity, the region 261b which has n-type conductivity, and the region that has p-type conductivity.

Through the above steps, the first transistor 101 which is an n-channel transistor can be formed as illustrated in FIG. 4C. Here, the first transistor 101 is formed using single crystal silicon or the like, thereby being capable of high-speed operation.

The steps after the insulating film 227 in FIGS. 3A to 3C is formed can be referred to for steps after the insulating film 265 is formed, as appropriate.

There is no particular limitation on the structure which is applied to one embodiment of the present invention as long as the structure of a transistor in which an oxide semiconductor is used for a semiconductor layer. FIGS. 4D and 4E each illustrate an example of a transistor formed over an insulating surface 501, which can be applied to one embodiment of the present invention.

The transistor illustrated in FIG. 4D includes a first gate electrode 503, an insulating film 505 over the first gate electrode 503, conductive layers 507a and 507b over the insulating film 505, an oxide semiconductor layer 509 which is formed over the insulating film 505 to overlap with the first gate electrode 503, an insulating film 511 over the conductive layer 507a, the conductive layer 507b, and the oxide semiconductor layer 509, and a second gate electrode 513 which is formed over the insulating film 511 to overlap with the oxide semiconductor layer 509.

In the transistor illustrated in FIG. 4D, a signal for controlling the switching of the transistor is input to one of the first gate electrode 503 and the second gate electrode 513; that is, the one of the first gate electrode 503 and the second gate electrode 513 functions as a gate electrode. The other of the first gate electrode 503 and the second gate electrode 513 may be electrically insulated to be in a floating state, or may be in a state where a potential is supplied from another element; that is, the other of the first gate electrode 503 and the second gate electrode 513 functions as a back gate electrode. In the case where a potential is supplied from another element, potentials with the same level may be applied to the first gate electrode 503 and the second gate electrode 513, or a fixed potential such as a ground potential may be applied only to the other of the first gate electrode 503 and the second gate electrode 513. By providing the back gate electrode, the threshold voltage of the transistor can be controlled.

When a back gate electrode is unnecessary, only one of the first gate electrode 503 and the second gate electrode 513 may be formed.

A transistor illustrated in FIG. 4E includes the first gate electrode 503, the insulating film 505 over the first gate electrode 503, an oxide semiconductor layer 519 which is formed over the insulating film 505 to overlap with the first gate electrode 503, conductive layers 517a and 517b over the oxide semiconductor layer 519, an insulating film 521 over the oxide semiconductor layer 519, the conductive layer 517a, and the conductive layer 517b, and a second gate electrode 523 which is formed over the insulating film 521 to overlap with the oxide semiconductor layer 519.

In the transistor illustrated in FIG. 4E, as in the transistor illustrated in FIG. 4D, one of the first gate electrode 503 and the second gate electrode 523 functions as a gate electrode and the other of the first gate electrode 503 and the second gate electrode 523 functions as a back gate electrode. By providing the back gate electrode, the threshold voltage of the transistor can be controlled. When a back gate electrode is unnecessary, only one of the first gate electrode 503 and the second gate electrode 523 may be formed.

This embodiment can be combined with any of the other embodiments as appropriate.

(Embodiment 3)

In this embodiment, one example of a memory device including the memory circuit of one embodiment of the present invention will be described with reference to FIGS. 5A and 5B and FIG. 6.

<Structure of Register>

Figure 5A:
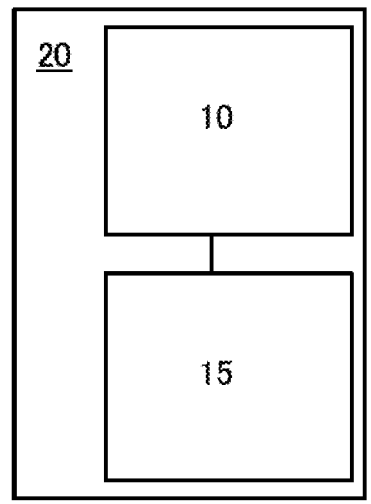
FIGS. 5A and 5B illustrate a register of one embodiment of the present invention.
Figure 6:
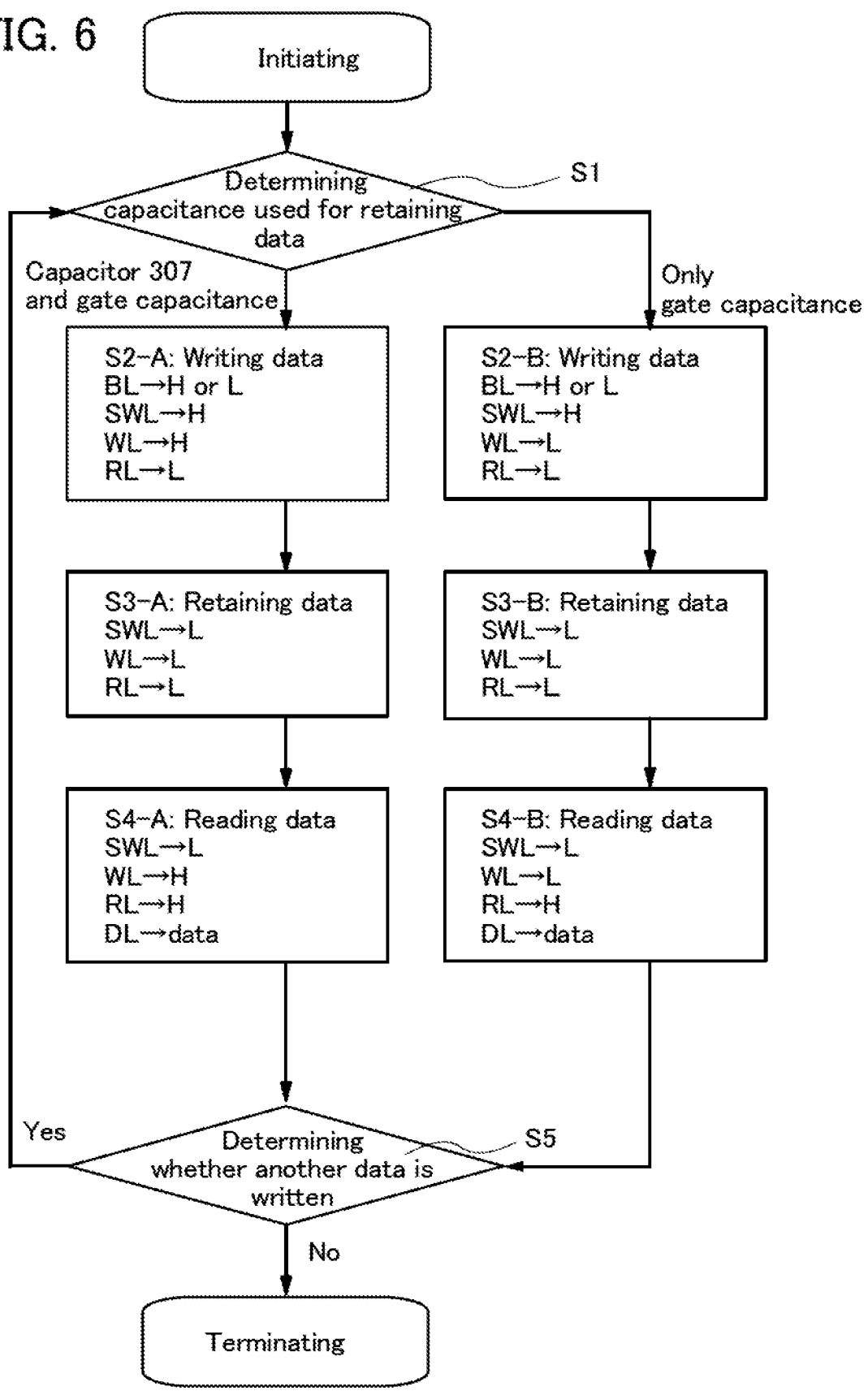
FIG. 6 is a flow chart showing operation of a register of one embodiment of the present invention.

A register 20 illustrated in FIG. 5A includes a memory circuit 10 of one embodiment of the present invention and a reading circuit 15.

Figure 5B:
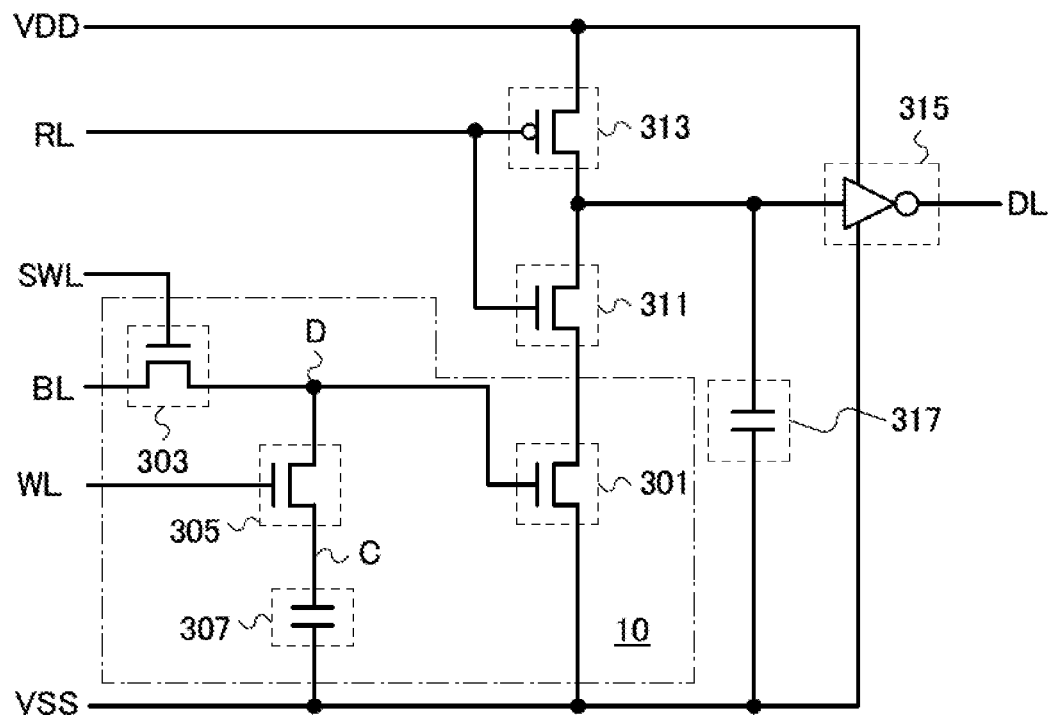

FIG. 5B illustrates a more specific structure of the register 20.

The memory circuit 10 which is one embodiment of the present invention and is illustrated in FIG. 5B includes a first transistor 301, a second transistor 303, a third transistor 305, and a capacitor 307.

The first transistor 301 includes a first gate electrode, a first source electrode, and a first drain electrode.

The second transistor 303 includes a second gate electrode, a second source electrode, and a second drain electrode. The second transistor 303 includes an oxide semiconductor in a channel formation region.

The third transistor 305 includes a third gate electrode, a third source electrode, and a third drain electrode. The third transistor 305 includes an oxide semiconductor in a channel formation region.

The first gate electrode is electrically connected to one of the second source electrode and the second drain electrode and one of the third source electrode and the third drain electrode. One of the first source electrode and the first drain electrode is electrically connected to a wiring for supplying a power supply potential VSS, one of electrodes of the capacitor 307, and one of electrodes of a capacitor 317. The other of the first source electrode and the first drain electrode is electrically connected to one of a source electrode and a drain electrode of a transistor 311. The second gate electrode is electrically connected to a switching signal line SWL. The other of the second source electrode and the second drain electrode is electrically connected to the bit line BL. The third gate electrode is electrically connected to a word line WL. The other of the third source electrode and the third drain electrode is electrically connected to the other of the electrodes of the capacitor 107.

A gate electrode of the transistor 311 is electrically connected to a read line RL and the gate electrode of a transistor 313. The other of the source electrode and the drain electrode of the transistor 311 is electrically connected to one of a source electrode and a drain electrode of the transistor 313, the other of the electrodes of the capacitor 317, and an input terminal of an inverter 315. The other of the source electrode and the drain electrode of the transistor 313 is electrically connected to a wiring for supplying a power supply potential VDD.

An output terminal of the inverter 315 is electrically connected to a data line DL. Note that the reading circuit can have any structure; for example, a sense amplifier circuit, a pull-up resistor, or the like, instead of the inverter 315 can be used instead of the inverter 315.

<Operation of Register>

Operation of the register will be described with reference to FIG. 6. Here, a high-level potential (H) or a low-level potential (L) is applied to the word line WL, the switching signal line SWL, the bit line BL, the read line RL, and the data line DL.

In addition, a node where the one of electrodes of the capacitor 307 and the other of the third source electrode and the third drain electrode are connected is denoted by node C. Further, a node where the first gate electrode, the one of the second source electrode and the second drain electrode, and the one of the third source electrode and the third drain electrode are connected is denoted by node D. Note that in this embodiment in this specification, gate capacitance means the gate capacitance of the first transistor 301, otherwise specified.

[Step S1: Determining Capacitance Used for Retaining Data]

First, in the register, capacitance used for retaining data is determined in accordance with a signal input from a control circuit which is connected to the register. In the case of using the capacitor 307 and the gate capacitance, a step S2-A, a step S3-A, and a step S4-A, which are described below, are performed in this order. In the case of using only the gate capacitance, a step S2-B, a step S3-B, and a step S4-B, which are described below, are performed in this order.

[Step S2-A: Writing Data by Using the Capacitor 307 and the Gate Capacitance]

A low-level potential (L) is applied to the read line RL to turn on the transistor 313 and turn off the transistor 311. As a result, the power supply potential VDD is applied to the input terminal of the inverter 315. A high-level potential (H) is applied to the word line WL and the switching signal line SWL to turn on the second transistor 303 and the third transistor 305. Then, a predetermined potential (a high-level potential (H) or a low-level potential (L)) is applied to the bit line BL; as a result, electric charge is accumulated in the capacitor 307 and the gate capacitance and accordingly the potential is applied to the node C and the node D (data writing).

[Step S3-A: Retaining Data by Using the Capacitor 307 and the Gate Capacitance]

A low-level potential (L) is applied to the word line WL and the switching signal line SWL to turn off the second transistor 303 and the third transistor 305. Accordingly, the potential applied to the node C and the node D is retained (data retention).

[Step S4-A: Reading Data by Using the Capacitor 307 and the Gate Capacitance]

A high-level potential (H) is applied to the word line WL and the read line RL to turn on the third transistor 305 and the transistor 311 and turn off the transistor 313. Here, the potential of the data line DL is determined depending on whether the potential retained in the node C and the node D is a potential at which the first transistor 301 is turned on or not.

In the case where a potential applied to the bit line BL is a high-level potential (H), the first transistor 301 is turned on and accordingly the power supply potential VSS is applied to the input terminal of the inverter 315. Therefore, the potential of the data line DL is the power supply potential VDD.

On the other hand, in the case where a potential applied to the bit line BL is a low-level potential (L), the first transistor 301 is turned off. Electric charge retained in the capacitor 317 makes the input terminal of the inverter 315 retain the power supply potential VDD. Therefore, the potential of the data line DL is the power supply potential VSS.

[Step S2-B: Writing Data by Using the Gate Capacitance]

A low-level potential (L) is applied to the read line RL to turn on the transistor 313 and turn off the transistor 311. Accordingly, the power supply potential VDD is applied to the input terminal of the inverter 315. A low-level potential (L) is applied to the word line WL to turn off the third transistor 305. A high-level potential (H) is applied to the switching signal line SWL to turn on the second transistor 303. Then, a predetermined potential (a high-level potential (H) or a low-level potential (L)) is applied to the bit line BL; as a result, electric charge is accumulated in the gate capacitance and accordingly the potential is applied to the node D (data writing).

[Step S3-B: Retaining Data by Using the Gate Capacitance]

A low-level potential (L) is applied to the switching signal line SWL to turn off the second transistor 303. Accordingly, the potential applied to the node D is retained (data retention).

[Step S4-B: Reading Data by Using the Gate Capacitance]

A high-level potential (H) is applied to the read line RL to turn on the transistor 311 and turn off the transistor 313. Here, the potential of the data line DL is determined depending on whether or not the potential retained in the node D is a potential at which the first transistor 301 is turned on.

In the case where a potential applied to the bit line BL is a high-level potential (H), the first transistor 301 is turned on and accordingly the power supply potential VSS is applied to the input terminal of the inverter 315. Therefore, the potential of the data line DL is the power supply potential VDD.

On the other hand, in the case where a potential applied to the bit line BL is a low-level potential (L), the first transistor 301 is turned off. Electric charge retained in the capacitor 317 makes the input terminal of the inverter 315 retain the power supply potential VDD. Therefore, the potential of the data line DL is the power supply potential VSS.

[Step S5: Determining Whether Another Data is Written]

The subsequent step of the step S5 depends on a signal input from the control circuit which is connected to the register. In the case of writing another data, the process returns to the step S1. In the case of not writing another data, the process is terminated.

As described above, in a memory device including the memory circuit of one embodiment of the present invention, data which needs to be retained for a long time can be retained for a long time while data which needs to be written within a short time can be written at high speed. The mode of the memory circuit of one embodiment of the present invention can be appropriately switched between a mode in which high-speed operation is performed and a mode in which data is retained for a long time, when the memory circuit of one embodiment of the present invention is used.

This embodiment can be combined with any of the other embodiments as appropriate.

(Embodiment 4)

In this embodiment, one example of a memory device in which memory circuits 400 of one embodiment of the present invention are arranged in matrix will be described with reference to FIGS. 7A and 7B.

<Structure of Memory Device>

Figure 7A:
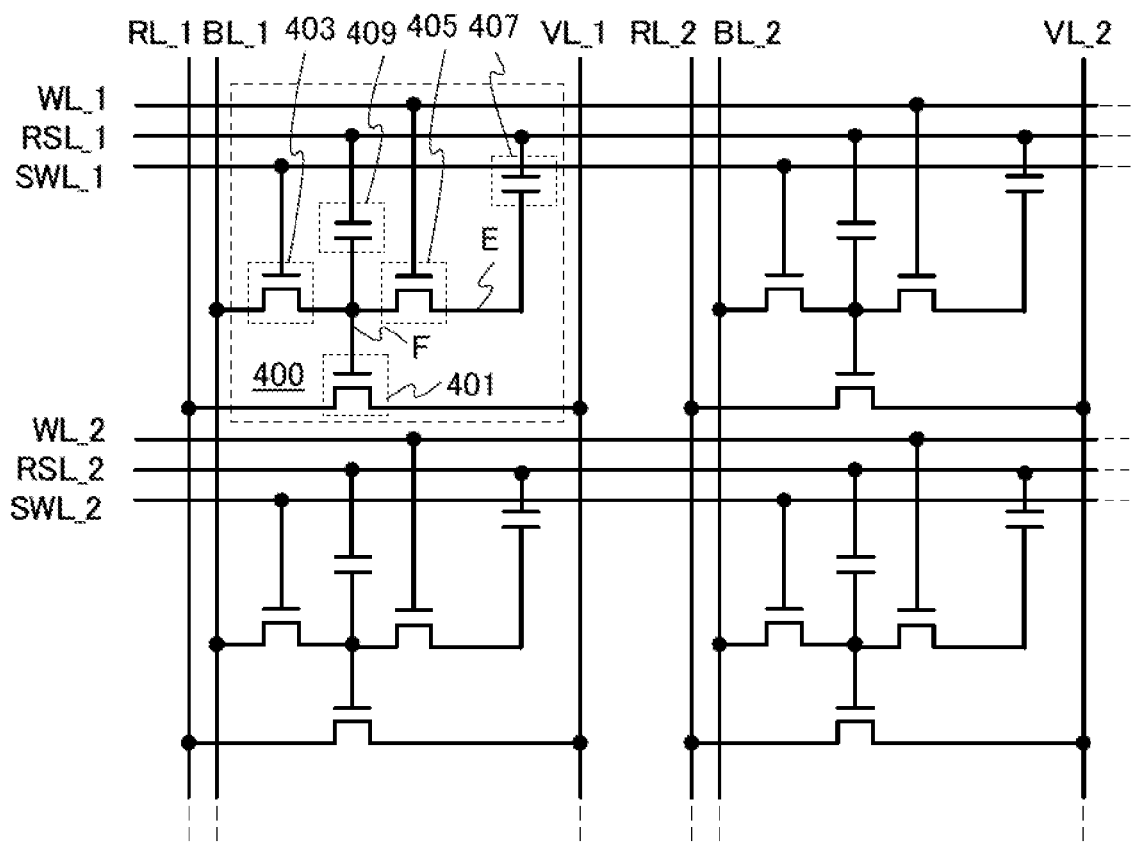
FIGS. 7A and 7B each illustrate a memory device of one embodiment of the present invention.

FIG. 7A illustrates a memory device in which the memory circuits 400 of one embodiment of the present invention are arranged in matrix with m rows and n columns (m and n are independently a natural number larger than or equal to 2). The memory device illustrated in FIG. 7A includes m word lines WL, m read selection lines RSL, m switching signal lines SWL, n bit lines BL, n read lines RL, and n power supply lines VL.

The memory circuits 400 in the a-th row (a is a natural number larger than or equal to 1 and smaller than or equal to m) are electrically connected to the word line WL_a, the read selection line RSL_a, and the switching signal line SWL_a. The memory circuits 400 in the b-th column (b is a natural number larger than or equal to 1 and smaller than or equal to n) are electrically connected to the bit line BL_b, the read line RL_b, and the power supply line VL_b.

The memory circuit 400 includes a first transistor 401, a second transistor 403, a third transistor 405, a capacitor 407, and a capacitor 409.

The first transistor 401 includes a first gate electrode, a first source electrode, and a first drain electrode.

The second transistor 403 includes a second gate electrode, a second source electrode, and a second drain electrode. The second transistor 403 includes an oxide semiconductor in a channel formation region.

The third transistor 405 includes a third gate electrode, a third source electrode, and a third drain electrode. The third transistor 405 includes an oxide semiconductor in a channel formation region.

Specifically, in the memory circuit 400 in the a-th row and the b-th column, the first gate electrode is electrically connected to one of the second source electrode and the second drain electrode, one of the third source electrode and the third drain electrode, and one of electrodes of the capacitor 409. One of the first source electrode and the first drain electrode is electrically connected to the power supply line VL_b. The other of the first source electrode and the first drain electrode is electrically connected to the read line RL_b. The second gate electrode is electrically connected to the switching signal line SWL_a. The other of the second source electrode and the second drain electrode is electrically connected to the bit line BL_b. The third gate electrode is electrically connected to the word line WL_a. The other of the third source electrode and the third drain electrode is electrically connected to one of electrodes of the capacitor 407. The read selection line RSL_a is electrically connected to the other of the electrodes of the capacitor 407 and the other of the electrodes of the capacitor 409.

In the memory device illustrated in FIG. 7A, the memory circuits 400 in the a-th row share the word line WL_a, the read selection line RSL_a, and the switching signal line SWL_a. The memory circuits 400 in the b-th column share the bit line BL_b, the read line RL_b, and the power supply line VL_b. The present invention is not limited to this structure. A plurality of word lines, a plurality of read selection lines, and a plurality of switching signal lines may be provided in the a-th row. A plurality of bit lines, a plurality of read lines, and a plurality of power supply lines may be provided in the b-th column.

Figure 7B:
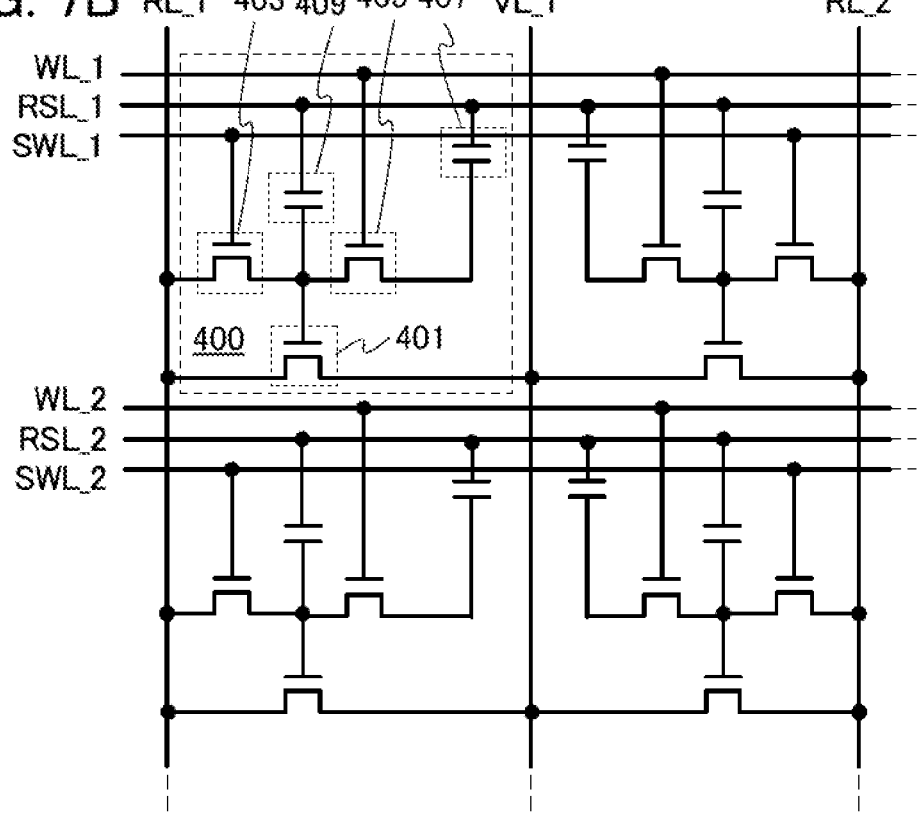

Alternatively, as illustrated in FIG. 7B, memory circuits in the c-th column and the (c+1)-th column (c is a natural number and an odd number larger than or equal to 1 and smaller than or equal to (b−1)) may share a power supply line. Alternatively or additionally, as illustrated in FIG. 7B, the other of the first source electrode and the first drain electrode, the other of the second source electrode and the second drain electrode, and the reading line may be electrically connected; that is, no bit line may be provided.

<Operation of Memory Device>

Operation of the memory device illustrated in FIG. 7A will be described. First, data writing, data retention, and data reading using the capacitor 407 and the gate capacitance in the memory circuit 400 in the first row and the first column will be described. Here, a node where the one of the electrodes of the capacitor 407 and the other of the third source electrode and the third drain electrode are connected is denoted by node E. In addition, a node where the first gate electrode, the one of the electrodes of the capacitance 409, the one of the second source electrode and the second drain electrode, and the one of the third source electrode and the third drain electrode are connected is denoted by node F. Note that in this embodiment in this specification, gate capacitance means the gate capacitance of the first transistor 401, otherwise specified.

[1-1: Data Writing Using the Capacitor 407 and the Gate Capacitance]

The potential of the word line WL_1 is set to a potential at which the third transistor 405 is turned on and the potential of the switching signal line SWL_1 is set at a potential at which the second transistor 403 is turned on, whereby the second transistor 403 and the third transistor 405 are turned on. Subsequently, a predetermined potential is applied to the bit line BL_1, so that electric charge is accumulated in the capacitor 407 and the gate capacitance; as a result, a potential is applied to the node E and the node F (data writing).

[1-2: Retaining Data Using the Capacitor 407 and the Gate Capacitance]

The potential of the word line WL_1 is set to a potential at which the third transistor 405 is turned off and the potential of the switching signal line SWL_1 is set to a potential at which the second transistor 403 is turned off, whereby the second transistor 403 and the third transistor 405 are turned off. Accordingly, the potentials applied to the node E and the node F are retained (data retention).

[1-3: Reading Data Using the Capacitor 407 and the Gate Capacitance]

Here, it is necessary that the first transistor 401 which is in another memory circuit and which is electrically connected to the read line RL_1 is certainly turned off. A predetermined potential is applied to the read selection lines RSL_2 to RSL_n to change the potential of the node F into a potential at which the first transistor 401 is turned off, through the capacitor 409. Accordingly, data can be certainly read from the memory circuit in the first row and the first column.

In the case of reading data, a predetermined potential (constant potential) is applied to the power supply line VL_1. The potential of the word line WL_1 is set to a potential at which the third transistor 405 is turned on, whereby the third transistor 405 is turned on. Here, the potential of the read line RL_1 is changed when the node E and the node F retain a potential at which the first transistor 401 is turned on, whereas the potential of the read line RL_1 is not changed when the node E and the node F retain a potential at which the first transistor 401 is turned off. That is, the data written to the memory circuit in the first row and the first column can be read by detecting a change in potential of the read line RL_1.

Next, data writing, data retention, and data reading using the gate capacitance of the first transistor 401 in the memory circuit 400 in the first row and the first column will be described.

[2-1: Writing Data Using the Gate Capacitance]

The potential of the word line WL_1 is set to a potential at which the third transistor 405 is turned off, whereby the third transistor 405 is turned off. The potential of the switching signal line SWL_1 is set to a potential at which the second transistor 403 is turned on, whereby the second transistor 403 is turned on. Subsequently, a predetermined potential is applied to the bit line BL_1, so that electric charge is accumulated in the gate capacitance; as a result, a potential is applied to the node F (data writing).

[2-2: Retaining Data Using the Gate Capacitance]

The potential of the switching signal line SWL_1 is set to a potential at which the second transistor 403 is turned off, whereby the second transistor 403 is turned off. Accordingly, the potential applied to the node F is retained (data retention).

[2-3: Reading Data Using the Gate Capacitance]

Here, it is necessary that the first transistor 401 which is in another memory circuit and which is electrically connected to the read line RL_1 is certainly turned off. A predetermined potential is applied to the read selection lines RSL_2 to RSL_n to change the potential of the node F into a potential at which the first transistor 401 is turned off, through the capacitor 409. Accordingly, data can be certainly read from the memory circuit in the first row and the first column.

In the case of reading data, a predetermined potential (constant potential) is applied to the power supply line VL_1. The potential of the word line WL_1 is set to a potential at which the third transistor 405 is turned on, whereby the third transistor 405 is turned on. Here, the potential of the read line RL_1 is changed when the node F retains a potential at which the first transistor 401 is turned on, whereas the potential of the read line RL_1 is not changed when the node F retains a potential at which the first transistor 401 is turned off. That is, the data written to the memory circuit in the first row and the first column can be read by detecting a change in potential of the read line RL_1.

As described above, in a memory device including the memory circuit of one embodiment of the present invention, data which needs to be retained for a long time can be retained for a long time while data which needs to be written within a short time can be written at high speed. The mode of the memory circuit of one embodiment of the present invention can be appropriately switched between a mode in which high-speed operation is performed and a mode in which data is retained for a long time, when the memory circuit of one embodiment of the present invention is used.

This embodiment can be combined with any of the other embodiments as appropriate.

(Embodiment 5)

A memory circuit, a register, and a memory device which are disclosed in this specification can be applied to a variety of electronic devices (including game machines). Examples of electronic devices are as follows: display devices such as televisions and monitors, lighting devices, desktop or laptop personal computers, word processors, image reproduction devices which reproduce still images or moving images stored in recording media such as digital versatile discs (DVDs), portable CD players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, air-conditioning systems such as air conditioners, dish washing machines, dish drying machines, clothes dryers, futon dryers, electric refrigerators, electric freezers, electric refrigerator-freezers, freezers for preserving DNA, smoke detectors, radiation counters, medical equipment such as dialyzers. Further examples include industrial equipment such as guide lights, traffic lights, belt conveyors, elevators, escalators, industrial robots, and power storage systems. In addition, oil engines, moving objects driven by electric motors using power from non-aqueous secondary batteries, and the like are also included in the range of electric devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts. Specific examples of these electronic device are illustrated in FIGS. 8A to 8E.

Figures 8A, 8B, 8C, 8D, 8E:
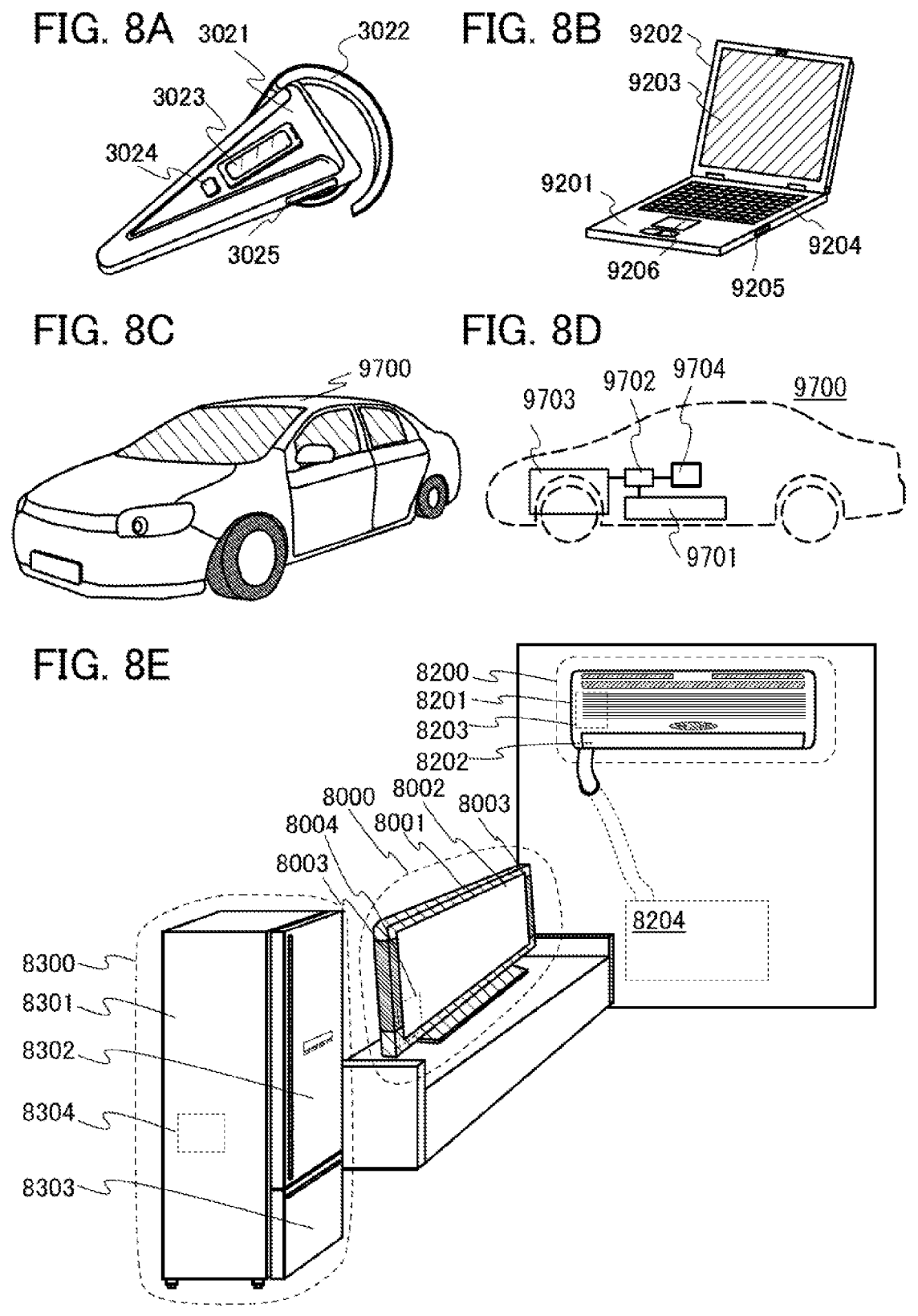

FIG. 8A illustrates a portable music player, which includes, in a main body 3021, a display portion 3023, a fixing portion 3022 with which the main body is worn on the ear, a speaker, an operation button 3024, an external memory slot 3025, and the like. The memory circuit, the register, and the memory device which are one embodiment of the present invention can be applied to a CPU or the like included in the main body 3021.

Furthermore, when the portable music player illustrated in FIG. 8A has an antenna, a microphone function, or a wireless communication function and is used with a mobile phone, a user can talk on the phone wirelessly in a hands-free way while driving a car or the like.

FIG. 8B illustrates a computer which includes a main body 9201, a housing 9202, a display portion 9203, a keyboard 9204, an external connection port 9205, a pointing device 9206, and the like. The memory circuit, the register, and the memory device which are one embodiment of the present invention can be applied to a CPU included in the main body 9201.

An electric vehicle 9700 illustrated in FIGS. 8C and 8D is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

In a television set 8000 illustrated in FIG. 8E, a display portion 8002 is incorporated in a housing 8001. The display portion 8002 can display an image and a speaker portion 8003 can output sound. Any of the memory circuit, the register, and the memory device which are one embodiment of the present invention can be used for a driver circuit for operating the display portion 8002 incorporated in the housing 8001.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

The television device 8000 may be provided with a receiver, a modem, and the like. With the receiver, the television device 8000 can receive general television broadcasting. Furthermore, when the television device 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU 8004 for performing information communication or a memory. The memory circuit, the register, and the memory device which are one embodiment of the present invention can be applied to the CPU 8004 or the memory.

An air conditioner illustrated in FIG. 8E includes an indoor unit 8200 and an outdoor unit 8204. The air conditioner is an example of an electronic device in which a memory circuit described in the above embodiment is used. Specifically, the indoor unit 8200 includes a housing 8201, a ventilation duct 8202, a CPU 8203, and the like. Although the CPU 8203 is provided in the indoor unit 8200 in FIG. 8E, the CPU 8203 may be provided in the outdoor unit 8204. Alternatively, the CPU 8203 may be provided in both the indoor unit 8200 and the outdoor unit 8204.

An electric refrigerator-freezer 8300 illustrated in FIG. 8E is an example of an electronic device which is provided with a memory circuit described in the above embodiment. Specifically, the electric refrigerator-freezer 8300 includes a housing 8301, a refrigerator door 8302, a freezer door 8303, a CPU 8304, and the like. The CPU 8304 is provided in the housing 8301 in FIG. 8E.

This embodiment can be combined with any of the other embodiments as appropriate.

This application is based on Japanese Patent Application serial no. 2012-090887 filed with Japan Patent Office on Apr. 12, 2012, the entire contents of which are hereby incorporated by reference.

What is claimed is:

1. A semiconductor device comprising:
a memory circuit comprising:
a first transistor;
a second transistor;
a third transistor; and
a first capacitor,
wherein a gate of the first transistor is electrically connected to one of a source and a drain of the second transistor,
wherein the one of the source and the drain of the second transistor is electrically connected to one of a source and a drain of the third transistor,
wherein the other of the source and the drain of the third transistor is electrically connected to a first electrode of the first capacitor,
wherein one of a source and a drain of the first transistor is electrically connected to a read line,
wherein the other of the source and the drain of the first transistor is electrically connected to a power supply line,
wherein a gate of the second transistor is electrically connected to a switching signal line,
wherein the other of the source and the drain of the second transistor is electrically connected to the read line,
wherein a gate of the third transistor is electrically connected to a word line,
wherein a second electrode of the first capacitor is electrically connected to a read selection line,
wherein each of the second transistor and the third transistor comprises a channel formation region comprising an oxide semiconductor, and
wherein the first transistor comprises a channel formation region comprising silicon.

2. The semiconductor device according to claim 1,
wherein the memory circuit is configured to hold a first data in a gate capacitance of the first transistor in the case where the first data is written into the memory circuit while the third transistor is in an off state, and
wherein the memory circuit is configured to hold a second data in the first capacitor in the case where the second data is written into the memory circuit while the third transistor is in an on state.

3. The semiconductor device according to claim 1, further comprising a second capacitor,
wherein a capacitance of the first capacitor is larger than a capacitance of the second capacitor, and
wherein a first electrode of the second capacitor is electrically connected to the gate of the first transistor.

4. An electronic device comprising the semiconductor device according to claim 1.

5. The semiconductor device according to claim 3, wherein a second electrode of the first capacitor and a second electrode of the second capacitor are electrically connected to a same wiring.

6. A semiconductor device comprising:
a first transistor;
a second transistor;
a third transistor;
a fourth transistor;
a fifth transistor;
a first capacitor; and
an inverter,
wherein a gate of the first transistor is electrically connected to one of a source and a drain of the second transistor,
wherein the one of the source and the drain of the second transistor is electrically connected to one of a source and a drain of the third transistor,
wherein the other of the source and the drain of the third transistor is electrically connected to a first electrode of the first capacitor,
wherein one of a source and a drain of the first transistor is electrically connected to one of a source and a drain of the fourth transistor,
wherein the other of the source and the drain of the fourth transistor is electrically connected to one of a source and a drain of the fifth transistor,
wherein a gate of the fourth transistor is electrically connected to a gate of the fifth transistor,
wherein the other of the source and the drain of the fourth transistor is electrically connected to an input terminal of the inverter,
wherein each of the second transistor and the third transistor comprises a channel formation region comprising an oxide semiconductor, and
wherein the first transistor comprises a channel formation region comprising silicon.

7. The semiconductor device according to claim 6, further comprising a second capacitor,
wherein a first electrode of the second capacitor is electrically connected to the input terminal of the inverter.

8. An electronic device comprising the semiconductor device according to claim 6.

9. The semiconductor device according to claim 7,
wherein a second electrode of the first capacitor is electrically connected to the other of the source and the drain of the first transistor, and
wherein a second electrode of the second capacitor is electrically connected to the other of the source and the drain of the first transistor.

10. A method for driving a semiconductor device comprising a first transistor, a second transistor, a third transistor and a first capacitor,
wherein a gate of the first transistor is electrically connected to one of a source and a drain of the second transistor,
wherein the one of the source and the drain of the second transistor is electrically connected to one of a source and a drain of the third transistor,
wherein the other of the source and the drain of the third transistor is electrically connected to a first electrode of the first capacitor,
wherein one of a source and a drain of the first transistor is electrically connected to a first wiring, and
wherein the other of the source and the drain of the first transistor is electrically connected to a second wiring,
the method comprising the steps of:
turning on the second transistor during a first period when the third transistor is in a first off state;
turning off the second transistor during the first period;
turning on the second transistor during a second period when the third transistor is in a first on state;
reading a first data from the second wiring during a third period when the
third transistor is in a second off state after the first period; and
reading a second data from the second wiring during a fourth period when the third transistor is in a second on state after the second period.

11. The method according to claim 10,
wherein each of the second transistor and the third transistor comprises a channel formation region comprising an oxide semiconductor, and
wherein the first transistor comprises a channel formation region comprising silicon.

* * * * *